United States Patent
Yosoku et al.

(10) Patent No.: US 9,141,470 B2
(45) Date of Patent: Sep. 22, 2015

(54) DECODING DEVICE

(71) Applicant: PANASONIC CORPORATION, Osaka (JP)

(72) Inventors: Naoya Yosoku, Kanagawa (JP); Hiroyuki Yoshikawa, Tokyo (JP); Hiroyuki Motozuka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 116 days.

(21) Appl. No.: 14/110,697

(22) PCT Filed: Mar. 5, 2013

(86) PCT No.: PCT/JP2013/001368
§ 371 (c)(1),
(2) Date: Oct. 8, 2013

(87) PCT Pub. No.: WO2013/140727
PCT Pub. Date: Sep. 26, 2013

(65) Prior Publication Data
US 2014/0082455 A1 Mar. 20, 2014

(30) Foreign Application Priority Data

Mar. 19, 2012 (JP) ................................ 2012-062492
Jun. 4, 2012 (JP) ................................ 2012-127288

(51) Int. Cl.
*H03M 13/00* (2006.01)
*G06F 11/10* (2006.01)
(Continued)

(52) U.S. Cl.
CPC ........... *G06F 11/10* (2013.01); *H03M 13/1137* (2013.01); *H03M 13/6527* (2013.01);
(Continued)

(58) Field of Classification Search
CPC .............. G06F 11/10; H03M 13/6527; H03M 13/6306; H03M 13/1137; H03M 13/1102; H03M 13/114; H03M 13/118; H03M 13/23; H03M 13/2472; H03M 13/2975; H03M 13/2978; H03M 13/6561; H04L 1/0057; H04L 1/0071; H04L 1/0066; H04L 1/005; H04L 1/0052
See application file for complete search history.

(56) References Cited

U.S. PATENT DOCUMENTS 8,286,050 B2 * 10/2012 Murakami et al. ............ 714/752
2009/0132893 A1 * 5/2009 Miyazaki et al. ............. 714/776
(Continued)

FOREIGN PATENT DOCUMENTS

JP    2007-110265 A    4/2007
JP    2008-288710 A    11/2008
(Continued)

OTHER PUBLICATIONS

Ishikawa et al., "High-Throughput LDPC Decoder Based on Memory-Reduction Method," IEICE Technical Report 105(570):29-34, ICD2005-220, Jan. 20, 2006.
(Continued)

*Primary Examiner* — Guerrier Merant
(74) *Attorney, Agent, or Firm* — Seed IP Law Group PLLC

(57) ABSTRACT

A decoding device has a decoding section that has a plurality of decoding cores which decode a received packet (e.g., likelihoods generated as a result of demodulation), which will become data to be decoded, in parallel on a per-likelihood basis and in which a first decoding core and a second decoding core of a plurality of decoding cores can perform decoding in parallel and a control section that controls decoding, wherein the decoding section lets the second decoding core decode a second likelihood when the second likelihood is input in the middle of the first decoding core decoding the first likelihood of the data to be decoded, whereby another likelihood can be decoded by use of another decoding core in the middle of decoding of a certain likelihood. Thus, entire decoding speed is increased.

5 Claims, 26 Drawing Sheets

(51) Int. Cl.
*H03M 13/11* (2006.01)
*H03M 13/37* (2006.01)

(52) U.S. Cl.
CPC ....... *H03M13/1117* (2013.01); *H03M 13/3715* (2013.01); *H03M 13/658* (2013.01); *H03M 13/6577* (2013.01)

(56) References Cited

U.S. PATENT DOCUMENTS

| 2010/0146361 A1* | 6/2010 | Yuan et al. | 714/752 |
| 2011/0200149 A1* | 8/2011 | Choi et al. | 375/341 |
| 2011/0239080 A1* | 9/2011 | Sakaue et al. | 714/752 |
| 2012/0297273 A1* | 11/2012 | Sakaue et al. | 714/773 |

FOREIGN PATENT DOCUMENTS

| JP | 2011-160491 A | 8/2011 |
| JP | 2012-039371 A | 2/2012 |

OTHER PUBLICATIONS

International Search Report, mailed Apr. 16, 2013, for PCT/JP2013/001368, 4 pages.

* cited by examiner

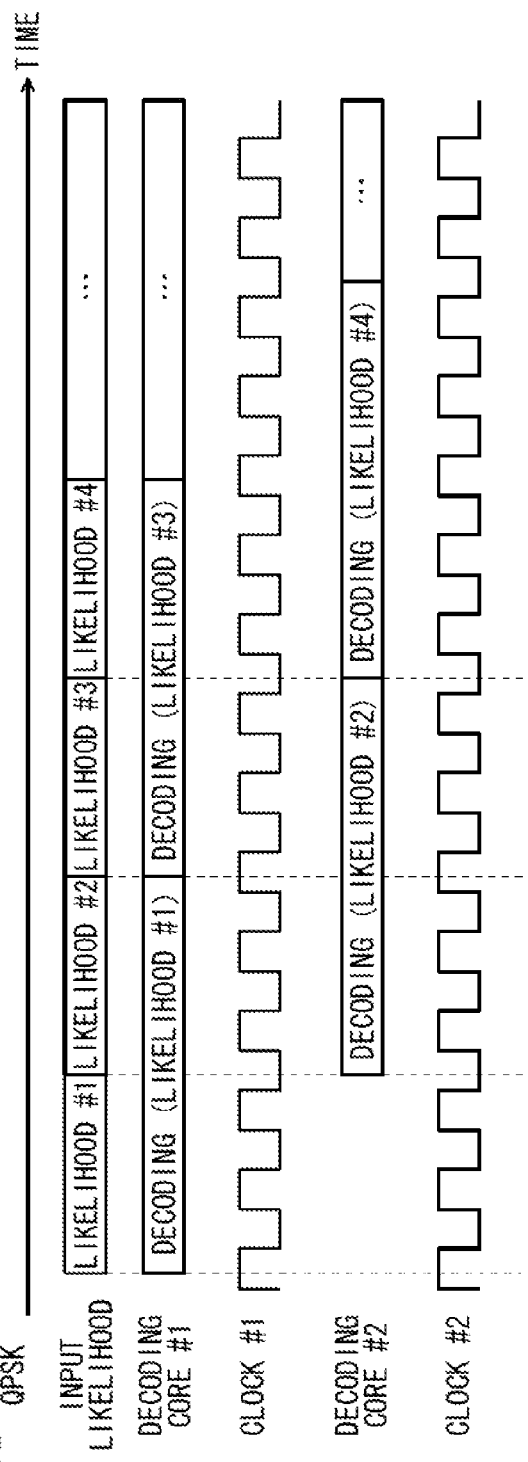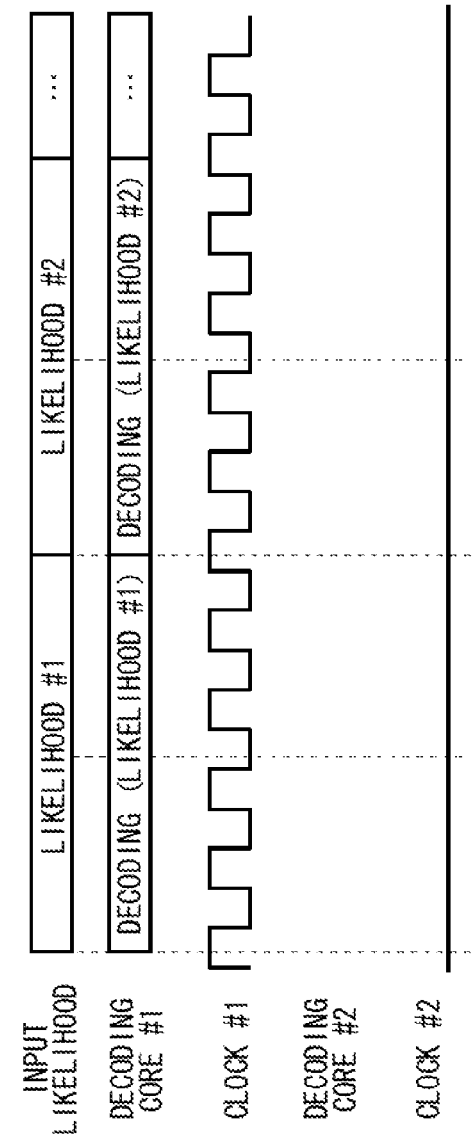

FIG. 12

| CHANNEL ENVIRONMENT ESTIMATE VALUE Pest (CNR, SNR, RSS1, etc.) | MCS (USER-ORIENTED: BEST EFFORT COMMUNICATION) | MCS (USER-ORIENTED: POWER SAVING OPERATION) |
|---|---|---|
| Pest<P1 | 1 | 1 |
| P1≦Pest<P2 | 2 | 2 |
| P2≦Pest | 3 | 2 |

FIG. 20

| NUMBER OF ITERATIONS DT1 WHEN PARITY CHECK IS OK | 0TH TIME | 1ST TIME | 2ND TIME | 3RD TIME |
|---|---|---|---|---|
| NUMBER OF SOFT DETERMINATION BITS DT2 | 5 BITS | 5 BITS | 5 BITS | 5 BITS |
| EFFECTIVE NUMBER OF BITS DT3 | 1 BIT | 2 BITS | 3 BITS | 4 BITS |
| NUMBER OF BITS FIXED TO 0 (LOWER ORDER BITS) DT4 | 4 BITS | 3 BITS | 2 BITS | 1 BIT |

TBL1

FIG. 21

| NUMBER OF ITERATIONS DT1 WHEN PARITY CHECK IS OK | 0$^{TH}$ TIME | 1$^{ST}$ TIME | 2$^{ND}$ TIME | 3$^{RD}$ TIME |
|---|---|---|---|---|
| NUMBER OF SOFT DETERMINATION BITS DT2 | 5 BITS | 5 BITS | 5 BITS | 5 BITS |
| EFFECTIVE NUMBER OF BITS DT3 | 3 BITS | 4 BITS | 5 BITS | 5 BITS |
| NUMBER OF BITS FIXED TO 0 (LOWER ORDER BITS) DT4 | 2 BITS | 1 BIT | — | — |

TBL2

DECODING DEVICE

TECHNICAL FIELD

A disclosure relates to a decoding device suitable for correcting errors in a signal that occur in a transmission path for communication.

BACKGROUND ART

Speeding up data transfer rate is requested in the field of information communication. To this end, decoding operation conforming to high speed transmission is required.

For instance, a method for partially practicing decoding operation in a parallel manner (a partial parallel decoding method) is described in Patent Document 1 as an example of the related art for practicing decoding operation conforming to high speed transmission.

RELATED ART DOCUMENT

Patent Document

Patent Document 1: JP-A-2007-110265

DISCLOSURE OF THE INVENTION

Problem that the Invention is to Solve

The inventors have conducted studies a decoding device that performs decoding operation conforming to high speed transmission. Yet, despite use of the related-art parallel processing method, difficulties have been encountered in yielding a decoding result that is sufficiently conforming to high speed transmission.

Accordingly the disclosure provides a decoding device capable of enhancing decoding capability sufficiently conforming to high speed transmission.

This disclosure is directed toward a decoding device including: a storage section configured to store a plurality of likelihoods generated by demodulation of a received packet; and a decoding section configured to have a plurality of decoding cores for decoding in parallel on a per-likelihood basis by use of respective partial check matrices into which an check matrix used for decoding is divided, wherein the partial check matrices are matrices having rows that are equal or greater in number to or than columns.

Advantage of the Invention

According to the disclosure, a decoding device capable of performing high speed decoding operation can be realized.

BRIEF DESCRIPTION OF THE DRAWINGS

FIGS. 8A and 8B are timing chart showing decoding timing of the second embodiment.

FIG. 12 is a drawing showing an example relationship between a channel environment and a user-oriented MCS.

FIG. 20 is a diagram showing example configuration (1) of an effective-number-of-bits table.

FIG. 21 is a diagram showing example configuration (2) of the effective-number-of-bits table.

EMBODIMENTS FOR IMPLEMENTING THE INVENTION

Figure 1:
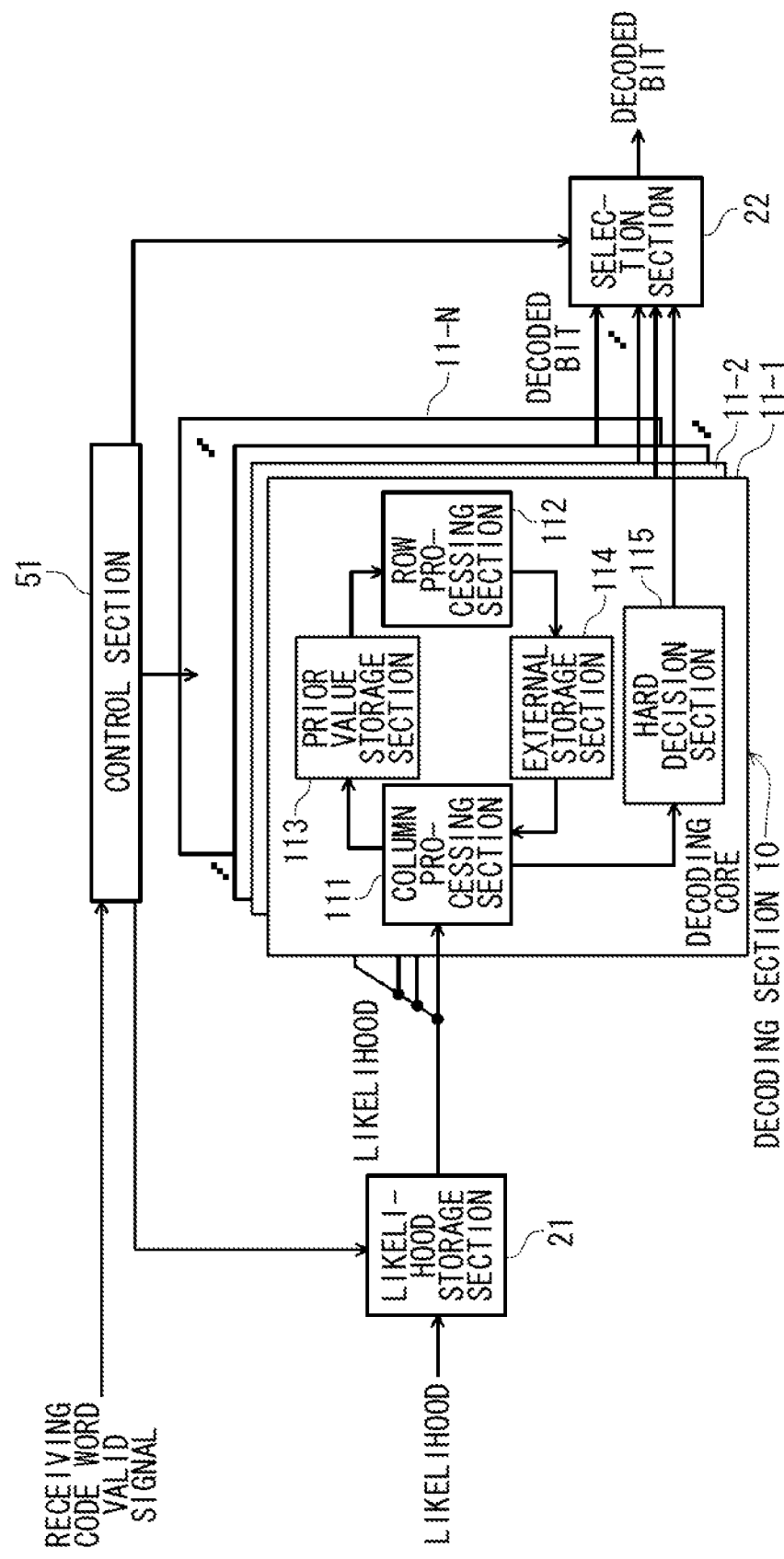
FIG. 1 is a block diagram showing a configuration of a decoding device of a first embodiment.

<Background to a First Embodiment of the Disclosure>

Sophistication of a communication function, including an increase in data transfer rate, has been pressed ahead in the field of information communication. For instance, even in the field of wireless communication typified by; for instance, wireless LAN (Local Area Network) and mobile communication, high-speed wireless communication is now in increasing demand. Standardization of; for instance, IEEE802.11ad, has been pursued as high speed wireless communication standards. In order to meet an increase in communication speed, high speed decoding is required even for error correction decoding.

The IEEE802.11ad adopts an LDPC (Low Density Parity Check) code as a code for correcting signal errors in a wireless channel that serves as a transmission path. Compared to a turbo code, the LDPC code has an advantage of being relatively easier to be implemented in a high speed decoding device.

Increasing a level of multi-level modulation of transfer data is mentioned as one method for increasing the communication speed further.

For instance, when a modulation scheme is changed from BPSK (Binary Phase Shift Keying, a level of multi-level modulation=one) to QPSK (Quadrature Phase Shift Keying, a level of multi-level modulation=two), the LDPC decoding apparatus is required to exhibit double processing capability in accordance with an increase of a level of multi-level modulation.

However, the partial parallel decoding method described in connection with Patent Document 1 has a problem of difficulty being encountered in doubling a processing throughput on condition that a clock rate is constant. Following is the reason for it.

In operation for decoding the LDPC code according to the partial parallel decoding method, column processing begins after completion of row processing of a target row.

An amount of arithmetic operation required for row processing (retrieval of the minimum value) per iteration that is one decoding unit is constant. Moreover, an amount of serially processable arithmetic operation per cycle of decoding operation is limited.

Even when processing capability per cycle is enhanced by increasing the number of partial parallel operations (i.e., the number of computing units), an amount of arithmetic operation of row processing is constant, and the number of serially processable arithmetic operations is limited. Accordingly, the number of processing cycles required for row processing per iteration is not reduced. This also applies to a case where row processing is initiated after completion of column processing.

Even when the number of partial parallel processing is increased, a processing time of one iteration causes a bottleneck, which poses difficulty to high speed processing. In the meantime, when a clock rate of a decoding circuit is increased in order to shorten the processing time, another problem of augmentation of power consumption will occur.

<Brief Overview of the Disclosure>

The first disclosure is directed toward a decoding device comprising: a storage section configured to store a plurality of likelihoods generated by demodulation of a received packet; and a decoding section configured to have a plurality of decoding cores for decoding in parallel on a per-likelihood basis by use of respective partial check matrices into which an check matrix used for decoding is divided, wherein the partial check matrices are matrices having rows that are equal or greater in number to or than columns.

Decoding operation can thereby be distributed over a plurality of decoding cores, and a first decoding core and a second decoding core are capable of parallel processing. Therefore, overall decoding speed can be increased, which also makes it possible to keep up with a change in a level of multi-level modulation of transmission data. The processing time can be shortened without increasing a clock rate of the decoding cores, which allows a reduction of power consumption. In addition, column processing is performed in a distributed manner on a per-decoding-core basis in conformity with the partial parallel decoding method, so that the processing time can be shortened.

A second disclosure is directed toward the decoding device defined in the first disclosure, further comprising: an MCS information acquisition section configured to acquire MCS information about the received packet; and a clock output section configured to selectively output a clock signal for operating the decoding cores, wherein, according to the MCS information, the clock output section feeds the clock signal to decoding cores that are smaller in number than the decoding cores to which the clock signal is fed during high speed communication, when a communication method for transmitting the received packet is predetermined low speed communication that is slower than predetermined high speed communication.

In the case of low speed communication, a clock signal is fed to the decoding cores that are smaller in number than those required for high speed communication, whereby a reduction in the number of decoding cores to be operated and power consumption can be accomplished.

A third disclosure is directed toward the decoding device defined in the first disclosure, further comprising: an MCS information acquisition section that acquires MCS information about the received packet; a clock output section that outputs, according to a level of multi-level modulation scheme included in the MCS information, a first clock signal used for normal operation of the decoding cores or a second clock signal that is slower than the first clock; and a power source section that, according to the level of multi-level modulation scheme included in the MCS information, outputs a first power source of normal operating voltage to be fed to the decoding section when the clock output section outputs the first clock signal and outputs a second power source which is lower than the normal operating voltage when the dock output section outputs the second clock signal.

When the communication method is a method that enables performance of processing at a processing rate that is lower than the maximum processing rate of the decoding core, power consumption can be reduced by lowering a clock frequency used for activating the decoding section. Power consumption can also be reduced by lowering a source voltage.

A fourth disclosure is directed toward the decoding device defined in the third disclosure, wherein the power source section notifies the other end of communication of information about allowable communication speed of a communication device of its own in an initial phase of communication with the other end and previously outputs a low voltage power of the second power source when the other end of communication is notified that low speed communication with a low level of multi-level modulation is allowed.

Allowance of low speed communication is thereby notified to the other end of communication, and the decoding cores are previously activated by use of the low voltage power source, whereby power consumption can be reduced.

A fifth disclosure is directed toward the decoding device defined in the fourth disclosure, further comprising a setting section configured to input user-oriented information about communication speed or power consumption, wherein, according to the user-oriented information, the clock output section selects a clock signal to be output, and, according to the user-oriented information, the power source section selects a voltage to be output. For instance, when a user is oriented toward electric power saving, priority is given to low speed communication. When the user is oriented toward best effort communication (high speed communication), priority is given to high speed communication.

For instance, when the user is oriented toward low power consumption operation than toward high speed communication, an allowable MCS is limited to a modulation and coding scheme for low speed communication (e.g., BPSK). In the meantime, when the user is oriented toward high speed communication, the allowable MCS is allowed up to a high-speed-communication modulation and coding scheme (e.g., QPSK).

Depending on a user's orientation; for instance, when the user is oriented toward power saving, priority is thereby given to low speed communication, so that power consumption can be reduced.

A sixth disclosure is directed toward the decoding device defined in the fourth disclosure or the fifth disclosure, further comprising: channel environment estimation section configured to estimate a channel environment for transmission of data to be decoded, wherein the decoding section sets the allowable communication speed by use of a channel environment estimate value for the initial phase of communication.

Allowable communication speed can be set according to a channel environment estimate value acquired at the start of communication. When low speed communication is allowed, power consumption can be reduced.

A seventh disclosure is directed toward the decoding device defined in any one of the first disclosure to the third disclosure, wherein the decoding device has a channel environment estimation section that estimates channel environment for transmission of data to be decoded. When a channel environment estimate value is determined to be a predetermined value or more on the basis of a result of estimation of the channel environment, the control section makes the number of decoding iterations in the decoding section smaller than that required when the channel environment estimate value is less than a predetermined value.

For instance, the decoding section has a plurality of decoding modes; namely a decoding mode of an MCS (e.g., BPSK or QPSK) in which the maximum number of iterations is 2r, and a decoding mode of another MCS (e.g., 16 QAM) in which the maximum number of iterations is "r" or less. The control section has a threshold table of channel environment estimate values that enable performance of communication by use of any of the decoding modes. When the channel environment estimate value acquired from the channel environment estimation section is in excess of a threshold value in the threshold table, an MCS which can be applied to communication is notified to the other side of communication.

When the channel environment estimate value is a predetermined value or more, the number of decoding iterations in the decoding core is thereby reduced. Error correction capability is assured when the channel environment is superior; the processing time can be shortened; and high speed decoding can be implemented.

<Embodiments>

Embodiments of the decoding device of the disclosure are hereunder described. Although the embodiments provided below are described by use of the decoding device of the disclosure, they can also be expressed as a method for specifying operation of the decoding device. In the embodiments, like constituent elements are assigned like reference numerals, and their repeated explanations are omitted.

(First Embodiment)

FIG. 1 is a block diagram showing a configuration of a decoding device of a first embodiment. The first embodiment is an example configuration that implements high speed decoding operation.

The decoding device of the embodiment includes a decoding section 10, a likelihood storage section 21, a selection section 22, and a control section 51.

The decoding section 10 includes a plurality of decoding cores 11-1 to 11-N. An illustrated example shows an example in which the decoding section has the N decoding cores 11-1 to 11-N; however, the number of decoding cores is arbitrary. In subsequent descriptions, the decoding cores 11-1 to 11-N (N is an integer of one or more) are often represented typically as a decoding core 11. The configuration and operation of the decoding core 11 are hereunder described.

The likelihood storage section 21 serving as an example storage section is configured with; for instance, memory, and stores a likelihood yielded by demodulation of a received packet as an example of data to be decoded. For instance, a receiver of a wireless communication device stores a likelihood that is generated by demodulation of a received signal. The data to be decoded are not restricted to the likelihood, and coded data can also be used as required.

The decoding core 11 of the decoding section 10 processes input likelihood data, thereby generating a decoded bit, which is equivalent to one code word, per unit time through use of decoding operation. The code word is an LDPC code word coded by a coding device. One code word is equivalent to one word that is generated by coding an information bit through use of LDPC coding. The decoding core 11 outputs a hard decision bit (a decoding bit) as a decoding result.

Figure 2:
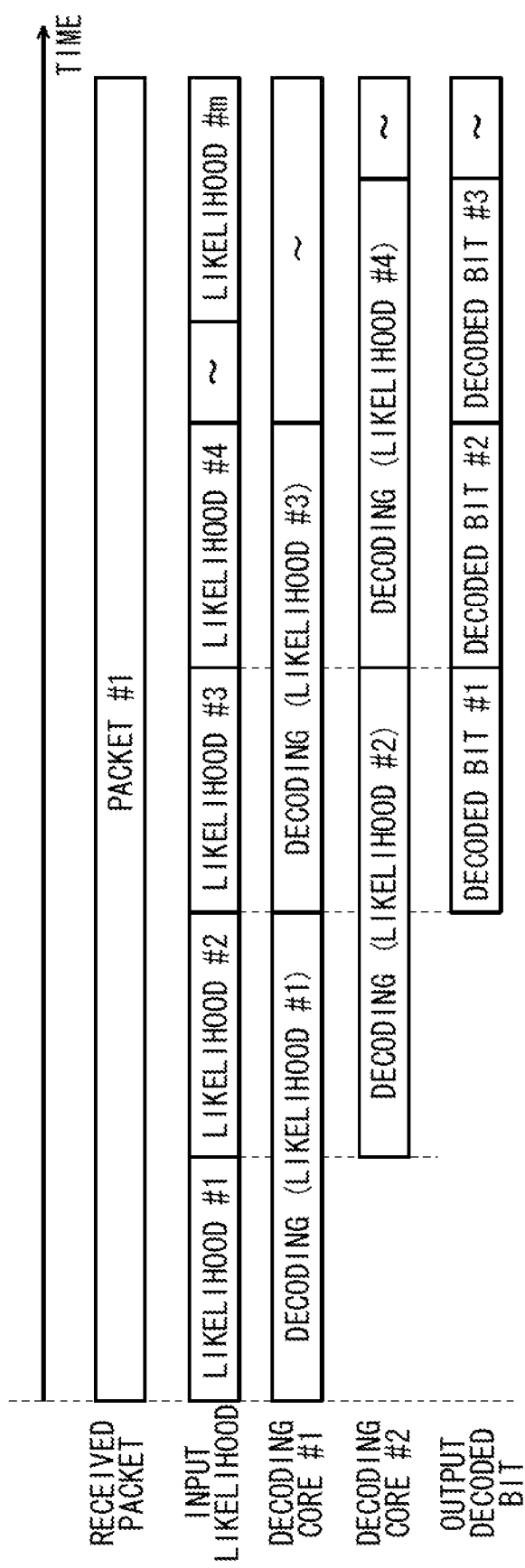
FIG. 2 is a timing chart showing decoding timing of the first embodiment.

FIG. 2 is a timing chart showing decoding timing of the first embodiment. A likelihood #1, a likelihood #2, a likelihood #3, a likelihood #4, . . . , a likelihood #m ("m" is an integer of one or more) are sequentially input, as a likelihood input from the likelihood storage section 21, to the decoding core 11 in time series. The likelihood #m is a likelihood corresponding to a code word #m.

The first decoding core 11-1 (the decoding core #1) decodes a first likelihood (the likelihood #1), outputting a first decoded bit (a decoded bit #1). The second decoding core 11-2 (the decoding core #2) decodes a second likelihood (the likelihood #2), outputting a second decoded bit (a decoded bit #2). The first decoding core 11-1 completes operation for decoding the likelihood #1 before initiating operation for decoding the likelihood #3. After completion of decoding operation, the first decoding core 11-1 initiates operation for decoding the likelihood #3.

Likewise, the plurality of decoding cores 11-1 and 11-2 hereafter decode input likelihoods one after the other. In the illustrated example, the two decoding cores 11-1 and 11-2 (the decoding cores #1 and #2) are alternately activated to perform decoding. However, three or more decoding cores can also be used and caused to perform decoding in parallel while decoding timings of the decoding cores are shifted in turn through similar procedures.

A control section 51 controls decoding operation of the decoding section 10. The control section 51 controls decoding timings of the plurality of decoding cores 11-1 to 11-N of the decoding section 10, thereby performing control operation such that decoding operation is performed at decoding timings conforming to a predetermined decoding scheduling. In the example shown in FIG. 2, the control section 51 controls the decoding section 10 in order to let the two decoding cores 11-1 and 11-2 (the decoding cores #1 and #2) perform decoding at the decoding timings.

The control section 51 makes a determination as to decoding timings by use of a "receiving code word valid signal." The receiving code word valid signal is provided as; for instance, a signal that shows a position of a likelihood in a packet determined by conversion of packet sync timing.

The control section 51 performs, at decoding timing of each likelihood, likelihood reading control operation for reading a likelihood to be decoded from the likelihood storage section 21. For instance, the control section 51 performs control operation for reading the likelihood #1 to the decoding core 11-1 (the decoding core #1) from the likelihood storage section 21 during decoding of the likelihood #1.

Under control of the control section 51, the selection section 22 selects and outputs a hard decision bit (a decoding bit)

from the plurality of decoding cores 11-1 to 11-N of the decoding section 10, whereby a decoding result is output in a correct sequence. The control section 51 controls selecting operation of the selection section 22 according to a decoding schedule. In the example shown in FIG. 2, the selection section 22 selects and outputs in sequence decoded bits that are obtained by decoding operation (the likelihood #1), decoding operation (the likelihood #2), decoding operation (the likelihood #3), decoding operation (the likelihood #4), . . . , decoding operation (the likelihood #m) ("m" is an integer of one or more). Output decoded bits shown in FIG. 2 correspond to the respective decoded bits that are selected and output by the selection section 22.

The configuration and operation of the decoding core 11 are now described in detail. The decoding core 11 includes a column processing section 111, a row processing section 112, a prior value storage section 113, an external value storage section 114, and a hard decision section 115.

The column processing section 11 performs column processing operation. The prior value storage section 113 stores a prior value generated by column processing of the column processing section 111. The row processing section 112 performs row processing operation. The external value storage section 114 stores an external value generated by row processing of the row processing section 112. The hard decision section 115 generates and outputs a hard decision bit by use of a soft decision value generated through decoding operation of the column processing section 111 and decoding operation of the row processing section 112.

Figure 3:
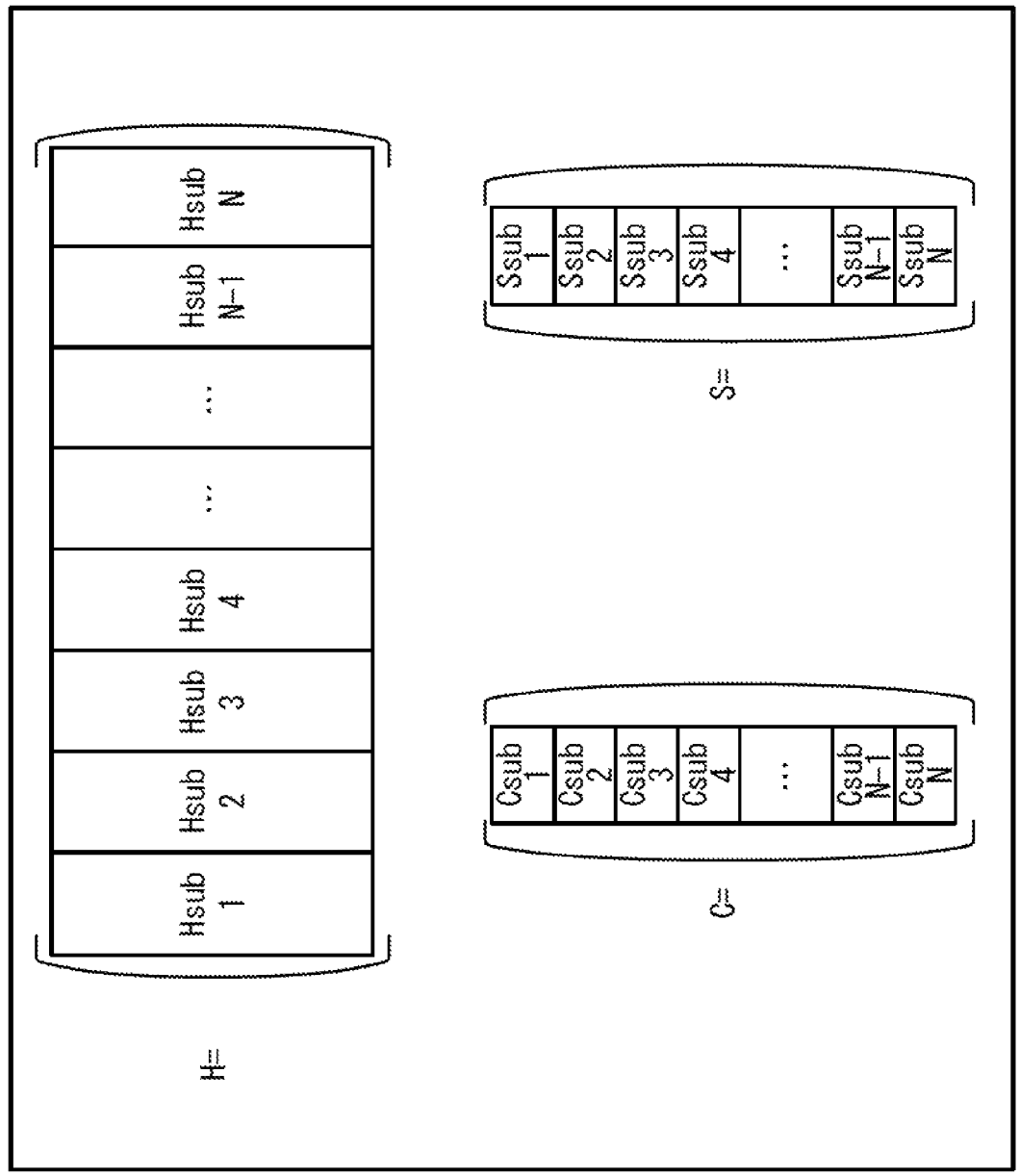
FIG. 3 is a drawing showing an check matrix divided into units of partial parallel decoding.

Decoding operation of the partial parallel decoding method is now described. FIG. 3 is a drawing showing examples of partial check matrices divided into units of partial parallel decoding, examples of likelihoods divided respectively in correspondence with the partial check matrices, and examples of code words used for dividing the likelihoods. In the embodiment, in order to decode target data, check matrices divided into partial parallel decoding units are used.

First, in relation to a check matrix H, the same matrix is used in both a coding device and a decoding device. A code word that is a data bit sequence coded by the coding device is decoded by the decoding device, whereby a decoded bit is obtained. Provided that the check matrix is H; that the code word is C; and that the likelihood is S, the coding device holds the following relationship $$H*C=0 \quad (1).$$

In the embodiment, the decoding device uses partial matrices that are made by dividing the check matrix H into units of partial parallel decoding, like Hsub 1, Hsub 2, Hsub 3, . . . , Hsub N−1, Hsub N. The check matrix H is divided such that the number of rows of the partial matrices into which the check matrix is divided becomes equal to or greater than the number of columns.

When a code word to be multiplied by the partial matrices that are formed by division of the check matrix H is now divided into Csub 1, Csub 2, Csub 3, . . . , Csub N−1, and Csub N, so as to fulfill Mathematical Expression (1), Mathematical Expression (2) provided below is derived.

[Hsub 1,Hsub 2, . . . ,Hsub N]

*[Csub 1$^T$,Csub 2$^T$, . . . ,Csub N$^T$]$^T$=0

[Hsub 1*Csub 1+, . . . ,+Hsub N*Csub N]=0 (2)

(T denotes "transposition")

Specifically, a vector of the code word is determined such that Hsub M (M is an integer) is multiplied by Csub M.

Next, the likelihood S employed in the decoding device is divided by use of a vector that has the same length as that of each of the divided code words Csub M. FIG. 3 shows a matrix that represents the divided likelihoods S by use of reference symbols; Ssub 1, Ssub 2, Ssub 3, Ssub N−1, Ssub N.

The likelihood is divided according to the method mentioned above.

The decoding core 11 of the embodiment performs column processing and row processing in sequence of Hsub 1, Hsub 2, Hsub 3, . . . , Hsub N.

In the embodiment, the check matrix is divided such that the number of rows of the partial matrices that are formed by division of the check matrix becomes equal to or greater than the number of columns.

Dividing is practiced as mentioned above for the following reasons.
(i) Memory capacity of the prior value storage section can be reduced.
(ii) The number of comparators used in row processing of partial parallel decoding operation can be reduced.
(iii) Memory capacity of the external value storage section can be reduced.

Of the reasons, factors for (ii) a reduction in the number of comparators and (iii) a reduction in memory capacity of the external value storage section are described hereunder. In the embodiment, explanations are provided by use of a Min-Sum decoding algorithm as a decoding method. The decoding method is not limited to the Min-Sum decoding algorithm, and another decoding method, including a Sum-Product decoding, can also be used. Details of the decoding algorithm are provided in; for instance, Reference Document 1 "Low Density Parity Check Code and Method for Decoding the Check Code" Tadashi WADAYAMA, Triceps Publication, Jun. 5, 2002, (pp. 92 to 99).

By means of processing of the column processing section 111 and processing of the row processing section 112, an external value αmn and a prior value βmn are determined by Mathematical Expressions (3) and (4) provided below.

[Mathematical Expression 1]

$$\text{External Value}: \alpha_{mn} = \left(\prod_{n' \in A(m)/n} \text{sign}(\beta_{mn'})\right) \min_{n' \in A(m)/n} |\beta_{mn'}| \quad (3)$$

[Mathematical Expression 2]

$$\text{Prior value}: \beta_{mn} = \omega \times \left(\lambda_n + \sum_{m' \in B(n)/m} \alpha_{m'n}\right) \quad (4)$$

Column processing and row processing for calculating an item of min|βmn| of Mathematical Expression (3) are sequentially performed for each of partial parallel processing units Hsub 1, Hsub 2, . . . , Hsub N. A current minimum value is taken as β_min. The current minimum value β_min is stored in the external value storage section 114.

The minimum value retrieved by means of row processing the Hsub 1 and the current minimum value β_min are compared with each other, whereby a smaller one becomes a new β_min.

$$\beta\_\text{min}=\min(\beta\_\text{min},\beta\_H\text{sub}\times) \quad (5)$$

where β_Hub× is taken as a β value that is determined by means of row processing of Hsub x.

From above, since comparative operation can be performed in a distributed manner in the embodiment, the number of comparators can be reduced by setting the number of partial matrices formed by division of the check matrix to the number of columns or more. Since all you need to do is to store an updated value as the current minimum value β_min, the memory capacity of the external value storage section 114 can be reduced.

On the subject of the above reasons, a factor for (i) a reduction in memory capacity of the prior value storage section is now described. In the embodiment, since a prior value resultant of column processing results can be used without being stored so as to be reflected on row processing, there can be obviated a necessity of storing all intermediate column processing results as in the partial parallel decoding method of the related art.

Specifically, the memory capacity of the prior value storage section is required until row processing is performed after completion of column processing corresponding to the partial matrix Hsub x and can be implemented by means of a pipeline register. Accordingly, the prior value storage section 113 can be configured as a pipeline register, so that the memory capacity of the prior value storage section 113 can be diminished. Details are described by use of FIG. 4.

Figure 4:
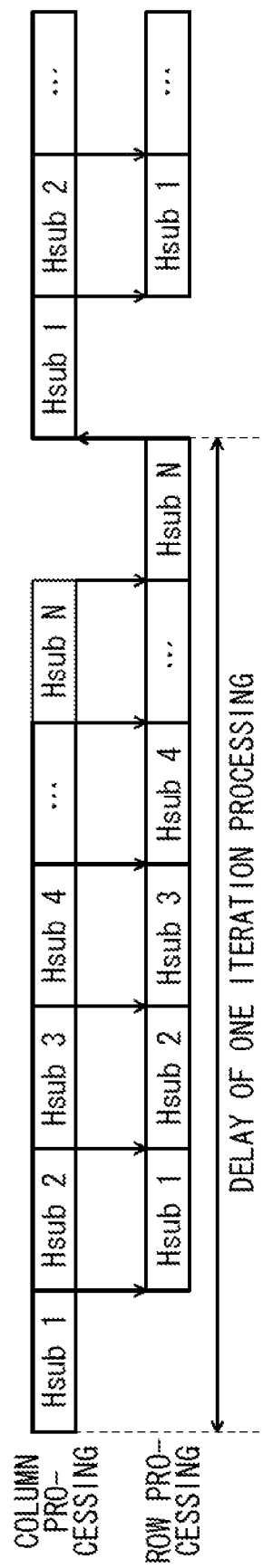
FIG. 4 is a timing chart showing timing of column processing and row processing in partial parallel decoding.

FIG. 4 is a drawing that shows timings of column processing and row processing in partial parallel decoding, showing decoding scheduling employed during decoding operation. The word "decoding scheduling" represents a sequence in which column processing and row processing of the partial parallel decoding method are performed.

During partial parallel decoding, row processing is practiced after completion of column processing of a column which includes a row to be processed. Therefore, processing is formed according to a sequence of column process Hsub 1 and row processing Hsub 1. Specifically, column processing Hsub 1 is performed; row processing Hsub 1 is subsequently practiced; and column processing Hsub 2 is then practiced.

Likewise, column processing and row processing are hereafter performed up to Hsub N. Row processing and column processing are sequentially subjected to pipeline processing from Hsub 1 up to Hsub N, and one iteration is completed at a point in time when row processing Hsub N is completed.

Therefore, a time involved in processing from the initiation of column processing Hsub 1 to the end of row processing Hsub N corresponds to a delay in one iteration processing. The next iteration can be initiated after completion of one iteration.

As above, row processing which uses a result of column processing is practiced after completion of column processing corresponding to Hsub x; hence, the prior value storage section 113 can be configured by use of a pipeline register having capacity commensurate with the partial matrix Hsubx.

In FIG. 4, row processing is not practiced at a time corresponding to column processing Hsub 1, so that a blank space is allocated to the time.

Figure 5:
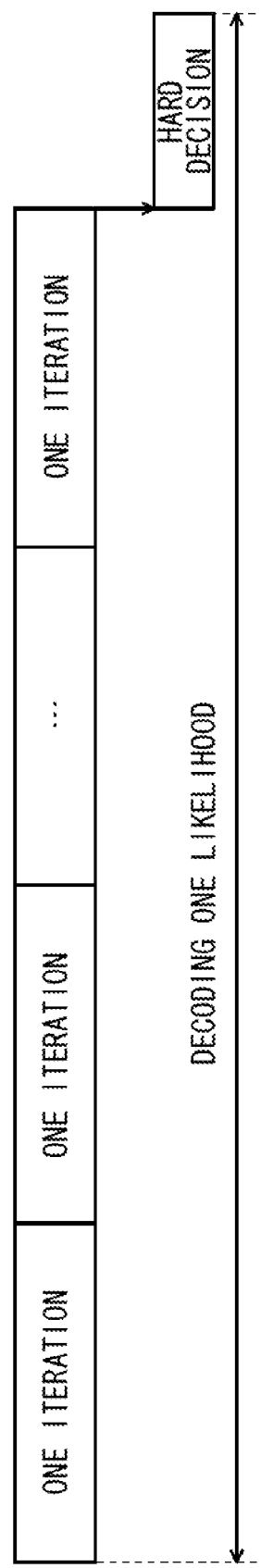
FIG. 5 is a diagrammatic illustration showing an entire process of decoding that is made up of partial parallel decoding.

FIG. 5 is a diagrammatic illustration showing all processes of decoding operation including partial parallel decoding. The column processing section 111 and the row processing section 112 perform one iteration of decoding a predetermined number of times. Subsequently, the hard decision section 115 makes a hard decision, whereupon decoding operation is completed. "One likelihood decoding" performed at this time corresponds to "Decoding (likelihood #x)" in FIG. 2.

Figure 6:
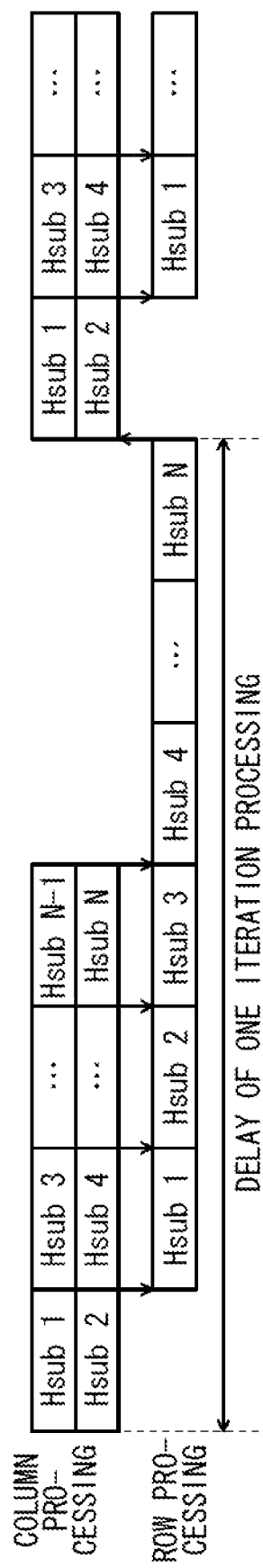
FIG. 6 is a timing chart showing a case where the number of parallel arithmetic operations of column processing is doubled during partial parallel processing.

FIG. 6 is a drawing showing an example case where the number of parallel processing operations of column processing performed during partial parallel decoding is doubled. Explanations are given to the fact that the delay in iteration processing is not reduced even when the number of parallel processing operations of column processing is doubled.

First, Hsub 1 and the Hsub 2 can be processed simultaneously by doubling the number of parallel processing operations of column processing. In the meantime, since retrieval of a minimum value (calculation of β_mm) is practiced by means of serial processing, row processing, unlike column processing, of Hsub 1 and Hsub 2 is not practiced by means of parallel processing.

Operation for collectively practicing row processing of Hsub 1 and Hsub 2 is represented as $$\beta\_min = min(\beta\_min, \beta\_Hsub\ 1, Hsub\ 2) \quad (6)$$

However, actual operation is expressed as $$\beta\_min\ 1 = min(\beta\_min, \beta\_Hsub\ 1)$$

$$\beta\_min = min(\beta\_min\ 1, \beta\_Hsub\ 2) \quad (7)$$

To be specific, in order to determine β_min, β_min 1 must first be determined, and hence serial processing is required.

For these reasons, the reduction of the processing delay becomes difficult, and the delay of one iteration processing requires a time that is the product of a processing time of one Hsub—which is the same as the processing time shown in FIG. 4—and (N+1). As a consequence, it is seen that a mere increase in the number of parallel processing operations of column processing poses difficulty in shortening the decoding time.

From above, the embodiment adopts a multi-core configuration in which the decoding section has a plurality of decoding cores, and decoding operation is distributed in a one-to-one correspondence with one decoding core. Under the related art decoding method in which the check matrix is not divided into partial matrices, row processing and column processing cannot be practiced by means of pipeline processing. Accordingly, in contrast to the processing delay in the related art; namely, the processing time of one Hsub×N×2, high speed decoding operation can be implemented.

Use of the above configuration enables shortening of a processing time per iteration without increasing a clock rate of the decoding circuit, so that an increase in power consumption, which would otherwise be caused by a speedup, can be curbed. Moreover, even when the partial parallel decoding method is used, the memory capacity of the prior value storage section and the external value storage section can be reduced, so that an increase in the size and complexity of the device and configuration, which would be otherwise be caused by the speedup, can be curbed.

(Second Embodiment)

Figure 7:
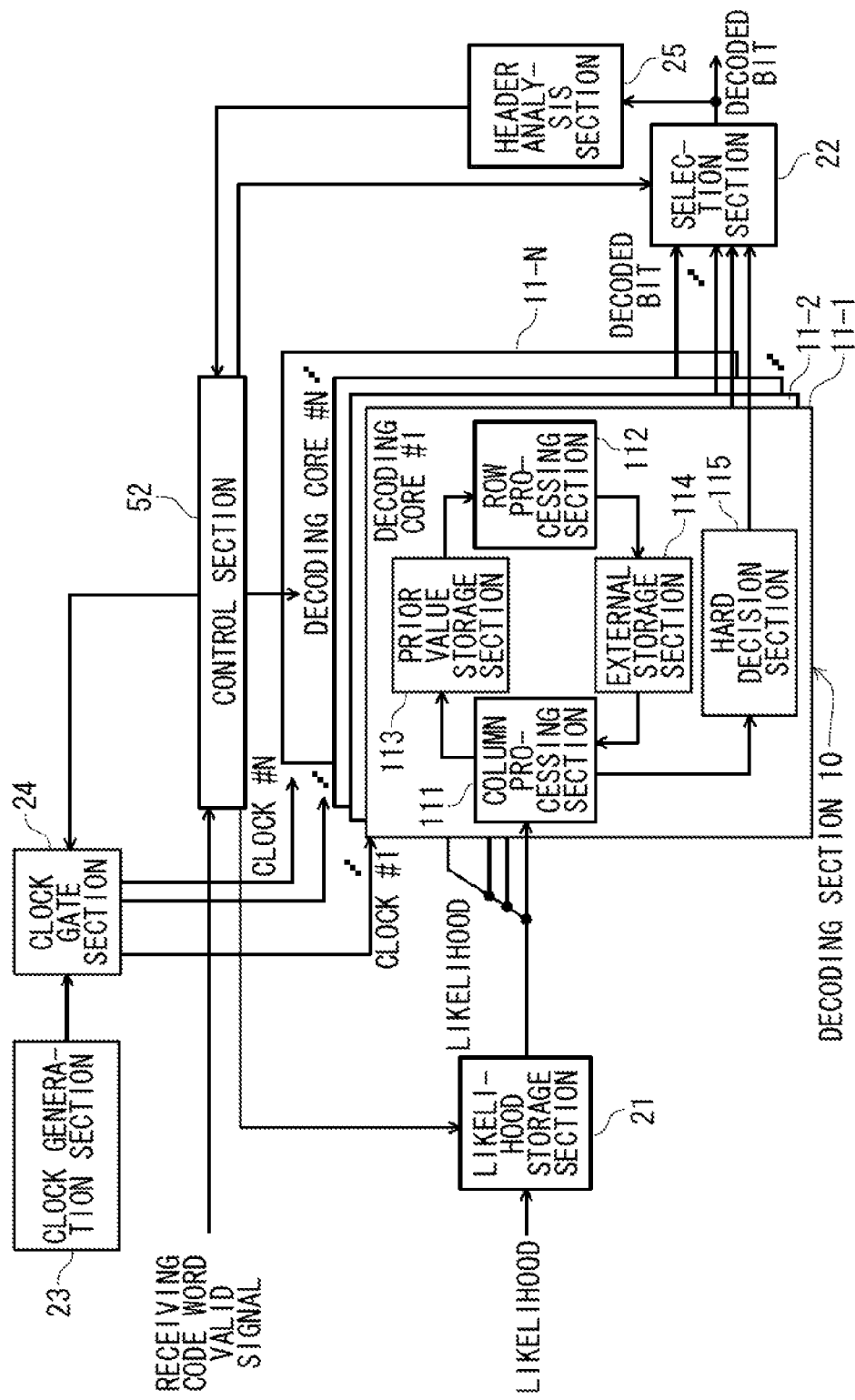
FIG. 7 is a block diagram showing a configuration of a decoding device of a second embodiment.

FIG. 7 is a block diagram showing a configuration of a decoding device of a second embodiment. The second embodiment is an example configuration that implements high speed decoding and low power consumption.

The decoding device of the second embodiment includes the decoding section 10, the likelihood storage section 21, the selection section 22, a clock generation section 23, a clock gate section 24, a header analysis section 25, and a control section 52.

For instance, a packet communication system conforming to IEEE802.11ad is conforming to a plurality of combinations of modulation schemes with coding rates. The plurality of combinations are called MCS (Modulation and Coding Schemes) information and written in a header of packet communication.

For instance, a decoding device that is conforming to a plurality of communication methods and that operates at its maximum capability during 2-bit/symbol QPSK communication has one bit of decoding core as a surplus during 1-bit/symbol BPSK communication. For this reason, there is a decoding core that will become idle.

Since the decoding core staying idle consumes electric power too, there is a problem of occurrence of unwanted power consumption. In the second embodiment, low-power-consumption operation is made feasible by reducing unwanted power consumption.

The header analysis section 25 serving as an example of an MCS information acquisition section analyzes a header in packet communication. The header includes MCS information. On the basis of an analysis result of the header in a received packet, the header analysis section 25 acquires MCS information, notifying the control section 52 of the thus-acquired MCS information.

The clock generation section 23 is configured with; for instance, an oscillator, and generates a clock signal for activating a circuit of the decoding device including the decoding section 10. The control section 52 controls a feed of clock signal from the clock gate section 24 to the decoding section 10 in accordance with the MCS information. The clock gate section 24 serving as an example of a clock output section can selectively output a clock signal. Under control of a control section 52, the clock gate section 24 gates the clock signal generated by the clock generation section 23, feeding a clock signal to each of the decoding cores 11-1 to 11-N or halting the feed of the clock signal.

FIG. 8 is a timing chart showing timing of decoding operation of the second embodiment. The second embodiment is on the premise that the decoding device conforms to a plurality of communication methods that are compatible and carry out communication while switching between QPSK communication and BPSK communication. FIG. 8(A) shows operation for QPSK communication, and FIG. 8(B) shows operation for BPSK communication. In the example, QPSK communication corresponds to predetermined high speed communication, and BPSK communication corresponds to predetermined low speed communication.

During QPSK communication, the clock gate section 24 feeds a clock signal to two decoding cores, thereby activating the respective decoding cores. Specifically, the clock gate section 24 feeds a clock signal #1 to the first decoding core 111 (the decoding core #1) and a clock signal #2 to the second decoding core 11-2 (the decoding core #2). Decoding operation is thereby performed in a distributed manner by means of the two decoding cores 11-1 and 11-2 in the same way as in the first embodiment shown in FIG. 2, thereby decoding the likelihoods #1, #2, #3, #4, . . . , #m.

During BPSK communication, the clock gate section 24 feeds a clock signal to coding cores that are smaller in number than those that are supplied with the clock signal during QPSK communication; for instance, one coding core in the embodiment, thereby activating the coding core. Specifically, the clock gate section 24 feeds the clock signal #1 to the first decoding core 11-1 (the decoding core #1), halting the feed of the clock signal to the second decoding core 11-2 (the decoding core #2). Thereby, in FIG. 8(B), one decoding core 11-1 performs decoding operation, decoding the likelihoods #1, #2, . . . , #m.

Compared to the QPSK communication, BPSK communication provides one-half a transfer rate of an individual code word (i.e., consumes a double transmission time) and one-half an input rate of an input likelihood. Therefore, the decoding core can perform decoding operation using its half processing capability (in a double processing time). Consequently, the control section 52 activates half the plurality of decoding cores 11-1 to 11-N in the decoding section 10, halting a remaining half of decoding cores that stay idle and thereby reducing unwanted power consumption.

From the above, in the embodiment, the clock signal for the decoding cores that will come into an idle sate is gated according to the MCS information that is obtained from a result of header analysis, thereby halting operation of the decoding cores that stay idle. Unwanted power dissipated by the decoding cores that stay idle can be reduced, and power consumption can be diminished. As a consequence, the configuration that implements high speed decoding reduces power consumption according to various operating conditions typified by; for instance, a communication method and a transfer rate, thereby enabling pursuit of further lower power consumption.

(Third Embodiment)

Figure 9:
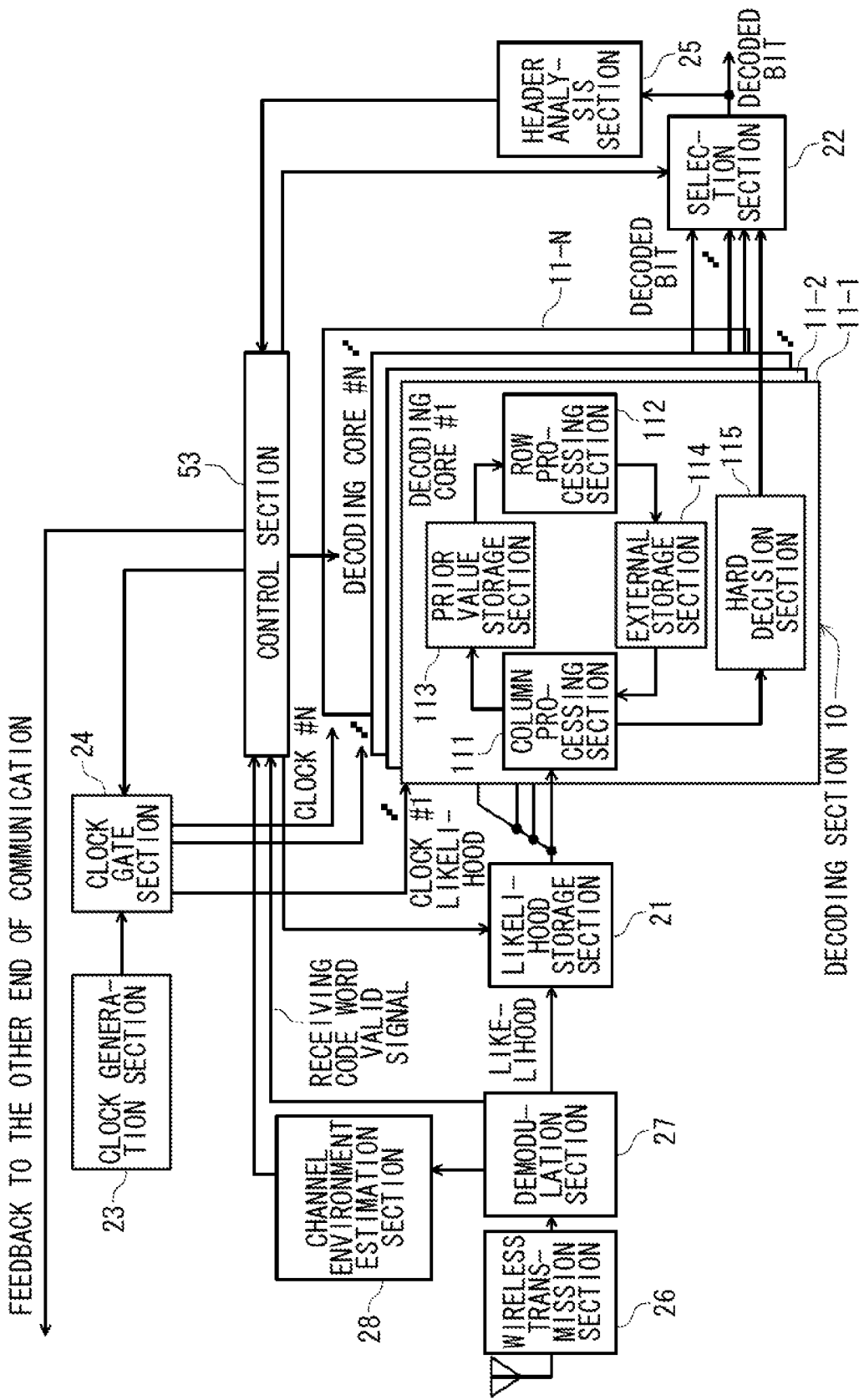
FIG. 9 is a block diagram showing a configuration of a decoding device of a third embodiment.

FIG. 9 is a block diagram showing a configuration of a decoding device of a third embodiment. The third embodiment is an example configuration that provides a high throughput even when the maximum number of iterations of the decoding device is a predetermined value or less, so long as a channel environment is superior.

The decoding device of the third embodiment includes the decoding section 10, the likelihood storage section 21, the selection section 22, the clock generation section 23, the clock gate section 24, the header analysis section 25, a wireless transmission section 26, a demodulation section 27, a channel environment estimation section 28, and a control section 53.

The wireless transmission section 26 has a high frequency circuit including an amplifier and a frequency converter and performs wireless signal processing including amplification and frequency conversion of a wireless signal received by the antenna. The demodulation section 27 is made up of; for instance, an electronic circuit having a signal processing circuit, and demodulates the received signal output from the wireless transmission section 26, outputting a likelihood of the received signal.

According to the received signal demodulated by the demodulation section 27, the channel environment estimation section 28 estimates quality of the received signal typified by; for instance, an SNR (Signal to Noise Ratio), a CNR (Carrier to Noise Ratio), and an RSSI (Received Signal Strength Indicator).

When determining that the channel environment is superior from a determination result of the channel environment made by the channel environment estimation section 28, the control section 53 decreases the number of decoding iterations in the decoding core 11.

For instance, the decoding device is presumed to have a first decoding mode conforming to an MCS (e.g., BPSK and QPSK) whose maximum number of iterations is 2r and a second decoding mode conforming to another MCS (e.g., 16 QAM) whose maximum number of iterations is "r" or less.

In the first decoding mode, the channel environment estimate value is less than a predetermined value, and low speed communication is often selected as a communication method.

In the second decoding mode, the channel environment estimate value is a predetermined value or more, and high speed communication is often selected as a communication method. When the channel environment is superior, decoding is performed with a small number of iterations by use of the second decoding mode.

The control section 53 feeds back to the other end of communication a message to the effect that high speed communication is possible.

Figure 10:
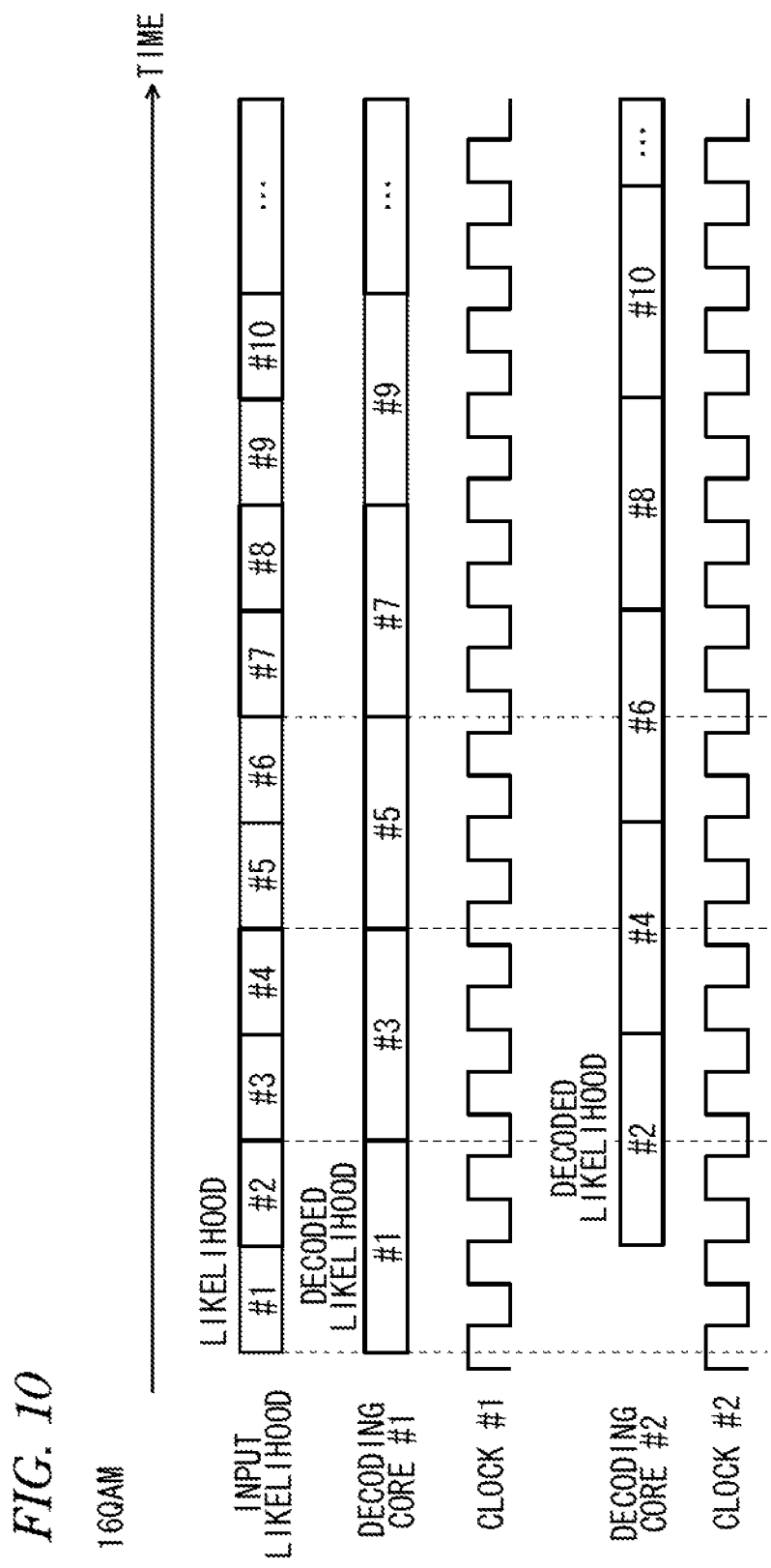
FIG. 10 is a timing chart showing decoding timing of the third embodiment.

FIG. 10 is a timing chart showing decoding timing of the third embodiment. The third embodiment is on the premise that 16 QAM communication is performed when the channel environment is superior. In 16 QAM communication, a transfer rate of each code word (an input rate of an input likelihood) is additionally twice as high as the transfer rate of QPSK (i.e., the transmission time becomes half that required during QPSK).

Since the input rate of the input likelihood is high during high speed communication, a conceivable measure to address the case is to use decoding cores that have a higher clock frequency or increase the number of decoding cores.

However, in the embodiment, even when the maximum number of iterations of the decoding device is a predetermined value or less, high speed communication is practiced in the superior channel environment by sending a feedback to the other end of communication, and a decoding time per likelihood is shortened by use of, in decoding operation, the second decoding mode with a smaller number of iterations. In the circumstance except the superior channel environment, the first decoding mode that is a decoding mode of the first embodiment or the second embodiment is used.

Although reducing the number of iterations results in deterioration of error correction capability, errors included in a received signal are statistically few by virtue of the superior channel environment. Since an incidence rate of an error is low, error corrections can be performed even with a small number of iterations.

In the embodiment, even when the maximum number of iterations achieved during high speed communication is the predetermined value or less, the decoding device can provide a high throughput by switching the first decoding mode to the second decoding mode when the channel environment is superior.

(Fourth Embodiment)

Figure 11:
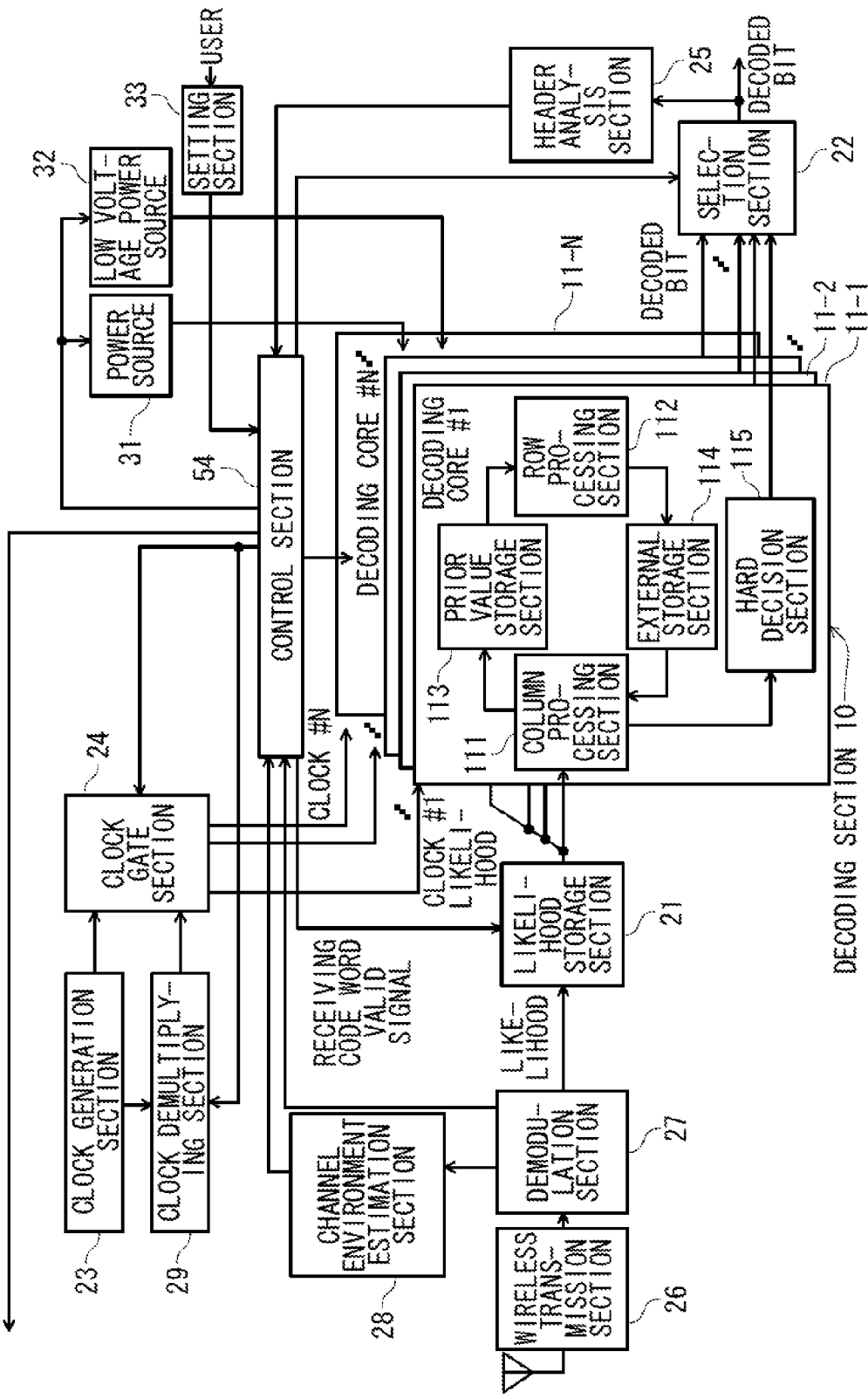
FIG. 11 is a block diagram showing a configuration of a decoding device of a fourth embodiment.

FIG. 11 is a block diagram showing a configuration of a decoding device of a fourth embodiment. The fourth embodiment is another example configuration for implementing lower power consumption of the decoding device.

The decoding device of the fourth embodiment includes the decoding section 10, the likelihood storage section 21, the selection section 22, the clock generation section 23, the clock gate section 24, the header analysis section 25, a wireless transmission section 26, a demodulation section 27, the channel environment estimation section 28, a clock frequency dividing section 29, a power source 31, a low voltage power source 32, a setting section 33, and a control section 54.

The clock frequency dividing section 29 includes; for instance, a frequency divider, and divides a clock frequency for circuit operation generated by the clock generation section 23, outputting a low speed clock signal. Under control of the control section 54, the clock gate section 24 switches between clock outputs, thereby feeding a clock signal from the clock generation section 23 or a low speed clock signal from the clock frequency dividing section 29 to the respective decoding cores 11-1 to 11-N. In the embodiment, the clock signal from the clock generation section 23 corresponds to a first clock signal, and the low speed clock signal from the clock frequency dividing section 29 corresponds to a second clock signal. The clock frequency dividing section 29 and the clock gate section 24 implement a function of the clock output section.

In the embodiment, the power source 31 corresponds to a first power source that outputs electric power of normal operating voltage. The low voltage power source 32 corresponds to a second power source that outputs electric power whose voltage is lower than the normal operating voltage. Each of the power source 31 and the low voltage power source 32 is implemented by a power source circuit that outputs predetermined electric power.

The setting section 33 receives a setting input made by the user and sets a user's orientation. Setting information about the user's orientation is sent to the control section 54. For instance, best-effort-oriented communication (high speed communication) or power-saving-oriented operation is set as a user's orientation.

In accordance with the user's orientation, the control section 54 feeds the low speed clock signal from the clock frequency dividing section 29 to the decoding section 10 during the low speed communication (at the time of a low throughput), thereby decreasing the clock rate and feeding the electric power from the low voltage power source 32 to the decoding section 10 to thus decrease a source voltage.

The decoding section 10 of the embodiment has; for instance, capability of performing decoding operation in accordance with communication speed of QPSK. So long as a modulation scheme of the received packet is BPSK, the decoding section 10 can perform decoding operation even when the clock rate is made low while the decoding method conforming to the communication speed of QPSK is used.

For instance, a normal clock frequency is taken as K, and a clock cycle count required for one likelihood decoding when decoding conforming to the communication speed of QPSK is practiced is taken as L. A time required to decode one likelihood at this time is Tq=L/K. The clock speed is now presumed to be set to a half of K/2. A time required to decode one code word at this time comes to Tb=L/(K/2)=2L K=2Tq; that is, a double time.

In the meantime, a time required to decode one likelihood during the decoding operation conforming to the communication speed of BPSK is Tb=2Tq. A reason for this is that QPSK entails a 2-bit/symbol transfer rate and that BPSK entails 1-bit/symbol transfer rate.

Therefore, the decoding section 10 conforming to QPSK can decode a packet using BPSK even when the clock speed is halved.

A level of multi-level modulation that the decoding section 10 can process is taken as N; a level of multi-level modulation scheme employed in the received packet is taken as M; and a dividing factor of the clock is taken as R.

The clock speed can be reduced if the decoding section 10 satisfies $$N/R \geq M \qquad (8)$$

Therefore, when the received packet is BPSK-modulated; in other words, when BPSK communication is carried out, the control section 54 reduces the clock speed according to the MCS information acquired from an analysis result of the header performed by the header analysis section 25. Under control of the control section 54, the clock gate section 24 feeds the low speed clock signal from the clock frequency dividing section 29 to the decoding core 11.

When the clock speed is low, the circuit can be activated even when the source voltage is decreased (see Reference Document 2: "Low energy LSI that operates at an ultra-low voltage," Journal of IEICE, Vol. 93, No. 11, pp 943 to 947, November 2010). For this reason, during BPSK communication, the control section 54 feeds low voltage electric power to the decoding core 11 by use of the low voltage power source 32.

In the fourth embodiment, when the communication method is a method that enables performance of processing at speed that is lower than the maximum processing speed of the decoding core 11, the clock signal fed to the decoding core 11 is switched to a low speed clock signal, thereby switching the power source to the low voltage power source. A voltage fed from the low voltage power source 32 is set to a value that is lower than a normal operating voltage fed from the power source 31 and equal to or higher than the minimum voltage at which the decoding core 11 can be activated by means of the low speed clock signal.

With regard to a relationship between the source voltage and the clock frequency of the circuit, as described in connection with Referenced Document 2, the circuit can be activated by setting an operating clock to a low speed even when the source voltage is lowered with reference to the normal operating voltage. Further, there is a description about a phenomenon that power consumption can be reduced by lowering the source voltage and the operation clock.

When the source voltage is lowered during BPSK communication with reference to the clock frequency and the source voltage set during QPSK communication, the clock frequency at which the decoding core 11 can operate is lowered by the reduction of the source voltage.

However, in the embodiment, the clock frequency required during BPSK communication is one-half the clock frequency required during QPSK communication. Hence, the decoding core 11 can perform operation that satisfies a desired number of iterations, so long as a lower limit on the reduction in operating clock frequency induced by the reduction of the source voltage is not less than one-half the original clock frequency. Power consumption can be reduced by further reductions in clock frequency and source voltage.

In the embodiment, when a change is made to the low voltage power source 32, a change is made to the clock frequency dividing section 29.

Circuit power consumption is proportional to a square of the source voltage and the operating clock frequency. Therefore, the reduction of power consumption can be attained by practicing low voltage activation and low speed clock operation.

When the source voltage is lowered, the low voltage power source can also be activated after analysis of the MCS of the received packet. In order to activate the decoding device more stably by use of the low voltage power source, however, the following control operation is practiced in the embodiment.

At a point in time when there is performed a handshake with the other side of communication at the initiation of communication, the control section 54 feeds back to the other side of communication information about allowable communication speed that the receiving side provides the other side of communication as permission (e.g., an MCS or a communication throughput).

A transmitter of the other side of communication performs communication at the allowable communication speed of the receiving side (i.e., a receiver with the decoding device of the embodiment). An allowable MCS is herein used as the allowable communication speed.

Figure 13:
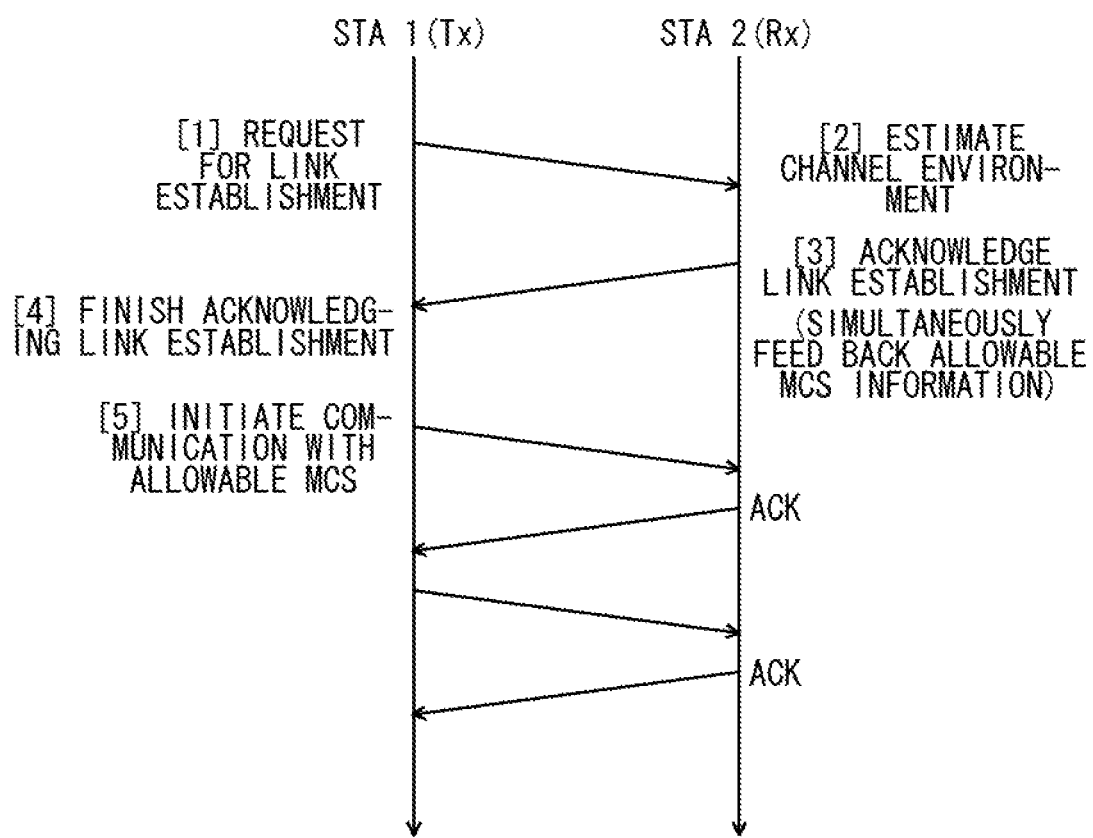
FIG. 13 is a sequence diagram showing handshake procedures employed during initialization of communication in the fourth embodiment.

FIG. 13 is a sequence diagram showing handshake procedures that are carried out during initialization of communication in the fourth embodiment. Each of a receiver STA 2(Rx) and a transmitter STA 1(Tx) on the other side of communication has the decoding device of the embodiment.

First, the transmitter STA 1 sends the receiver STA 2 a request for link establishment [1], and the receiver STA 2 estimates a channel environment upon receiving the link establishment request [2]. The receiver STA 2 then acknowledges link establishment [3], feeding back allowable MCS information to the transmitter STA 1 by reference to an MCS that conforms to the preset user's orientation.

The transmitter STA 1 finishes acknowledging the link establishment upon receipt of the allowable MCS information [4]. Subsequently, the transmitter STA 1 starts communication through use of the allowable MCS, transmitting transmission data to the receiver STA 2 [5]. Communication then takes place by use of the MCS set between the transmitter STA 1 and the receiver STA 2. When received data can be successfully demodulated and decoded, the receiver STA 2 feeds back an ACK signal to the transmitter STA 1.

In order to notify the other end of communication of the allowable communication speed information at the initialization of communication, the decoding device on the receiving side can be previously activated by means of the low voltage power source.

In addition, the allowable communication speed information typified by the MCS allowed by the receiving side can also be controlled according to the user's orientation. For instance, the user is oriented toward low-power-consumption operation than toward high speed communication, the control section 54 limits the allowable MCS to; for instance, BPSK. In the meantime, when the user is oriented toward high speed communication, the control section 54 implements; for instance, control operation to the effect that the allowable MCS is not more than QPSK.

FIG. 12 is a drawing showing an example relationship between the channel environment and the user-oriented MCS. The control section 54 has, as user-oriented information, a table about a correlation between the channel environment estimate values and the user-oriented MCS. Let MCS values 1 through 3 be defined in such a way that reference numeral 1 denotes communication of a low transfer rate (e.g., BPSK); that reference numeral 2 denotes communication of a middle transfer rate (e.g., QPSK); and that reference numeral 3 denotes communication of a high transfer rate (e.g., 16QAM).

In best-effort-oriented communication (speed-oriented communication), priority is given to a transfer rate, and high speed communication is performed in the transmission path environment. In the case of power-saving-oriented operation, priority is given to power consumption. Even when the channel environment is superior, low speed or middle speed communication is practiced.

The control section 54 compares the estimated transmission path environment estimate value Pest (e.g., the CNR, the SNR, and the RSSI) with threshold values described in a table (P1 and P2 in the example shown in FIG. 12), feeding back a corresponding MCS to the transmission side. The transmission-side communication device determines the MCS in accordance with the feedback information and sends transmission data that are generated according to the MCS.

In the embodiment, when low speed communication is performed in conformity to processing capability of the decoding circuit, power consumption is reduced by use of the low speed clock and the low voltage power source, whereby much lower power consumption can be realized.

<Background to Another Implementation Mode of the Disclosure>

A volume of data increases as the quality of electronic equipment that handles videos and audio becomes more enhanced, whereby a volume of data to be exchanged is also increasing even in the field of a communication system. Additional reductions in size, cost, and power consumption of the electronic equipment (e.g., a cellular phone) have been sought. Moreover, the communication system is required to exchange data with the minimum number of errors. For these reasons, an error correction function (e.g., FEC: Forward Error Correction) plays a crucial role in data communication.

The error correction technique has hitherto shifted from hard decision error correction (e.g., a Reed-Solomon code and a BCH code) to soft decision error correction (e.g., Viterbi decoding). However, soft decision error correction that exhibits higher correction capability [e.g., a Turbo code or a low density parity check (LDPC: Low-Density Parity-Check) code] is recently used.

In view of correction capability, the soft decision error correction code is enhanced by expressing a likelihood of received data through use of a plurality of bits (a soft decision) rather than determinately expressing received data as a binary bit sequence consisting of 0s and 1s (a hard decision).

Recent error correction coding systems use the turbo code and the LDPC code as outcomes of efforts to meet a challenge pertinent to how to implement communication approximate to the Shannon limit that is the theoretical limit.

Use of an error correction code that employs the turbo code or the LDPC code results in an increase in complexity of a circuit configuration and circuit scale. A factor for complication is that an error correction circuit that is now in actual use includes operation for making corrections to received data in the course of being transmitted. Accordingly, the electric power consumed by the error correction circuit also becomes larger, which imposes a hindrance to miniaturization and attainment of lower power consumption.

Another factor for an increase in circuit scale is the number of bits of data to be processed. Specifically, in relation to the soft decision, the likelihood of the receive data is expressed by means of a plurality of bits. Therefore, the larger the number of bits of data (i.e., a soft decision value) increases, the larger a circuit scale also increases. An increase in the number of bits also leads to an increase in circuit power consumption.

Figure 25:
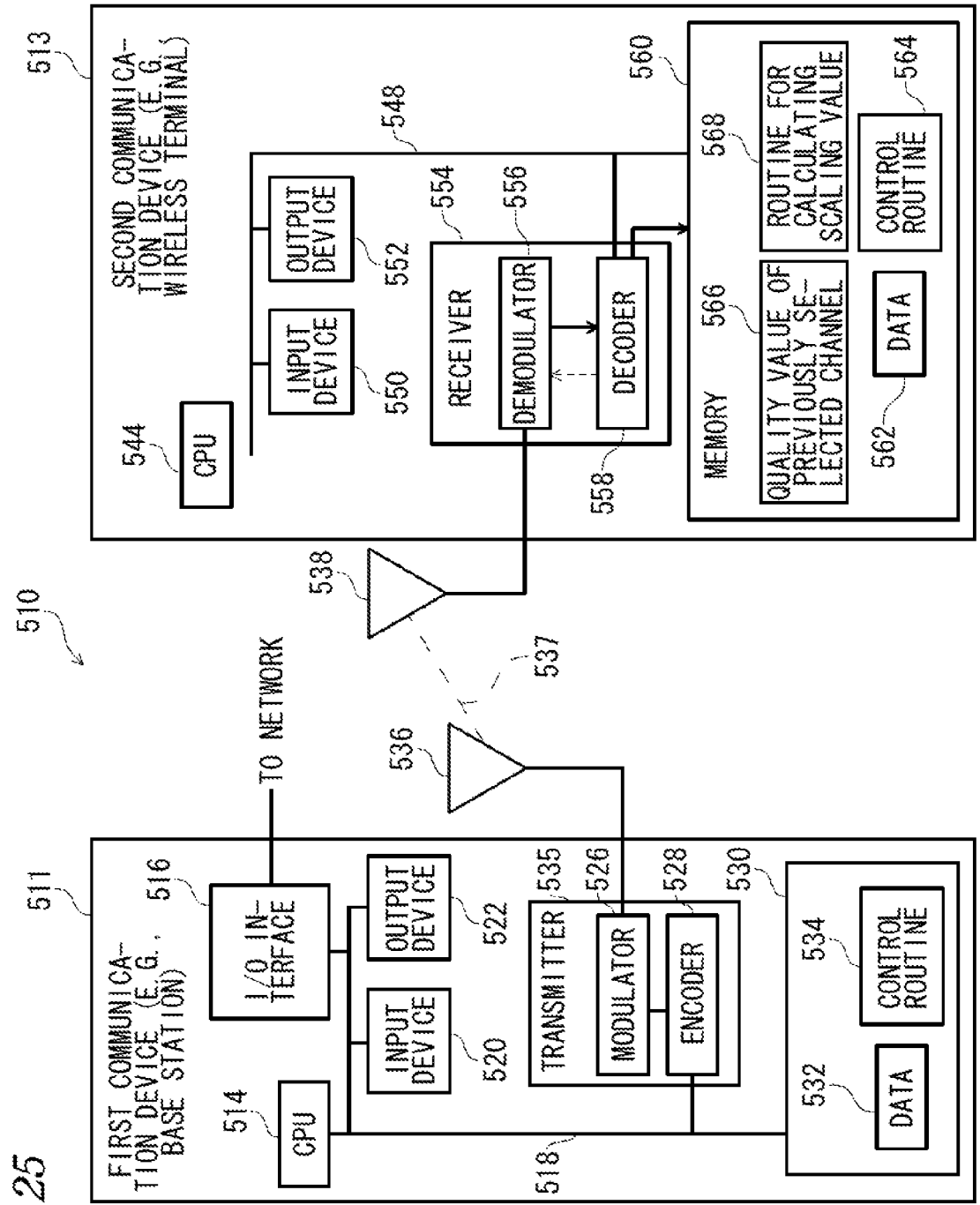
FIG. 25 is a block diagram showing a brief overview of Reference Patent Document 1.
Figure 26:
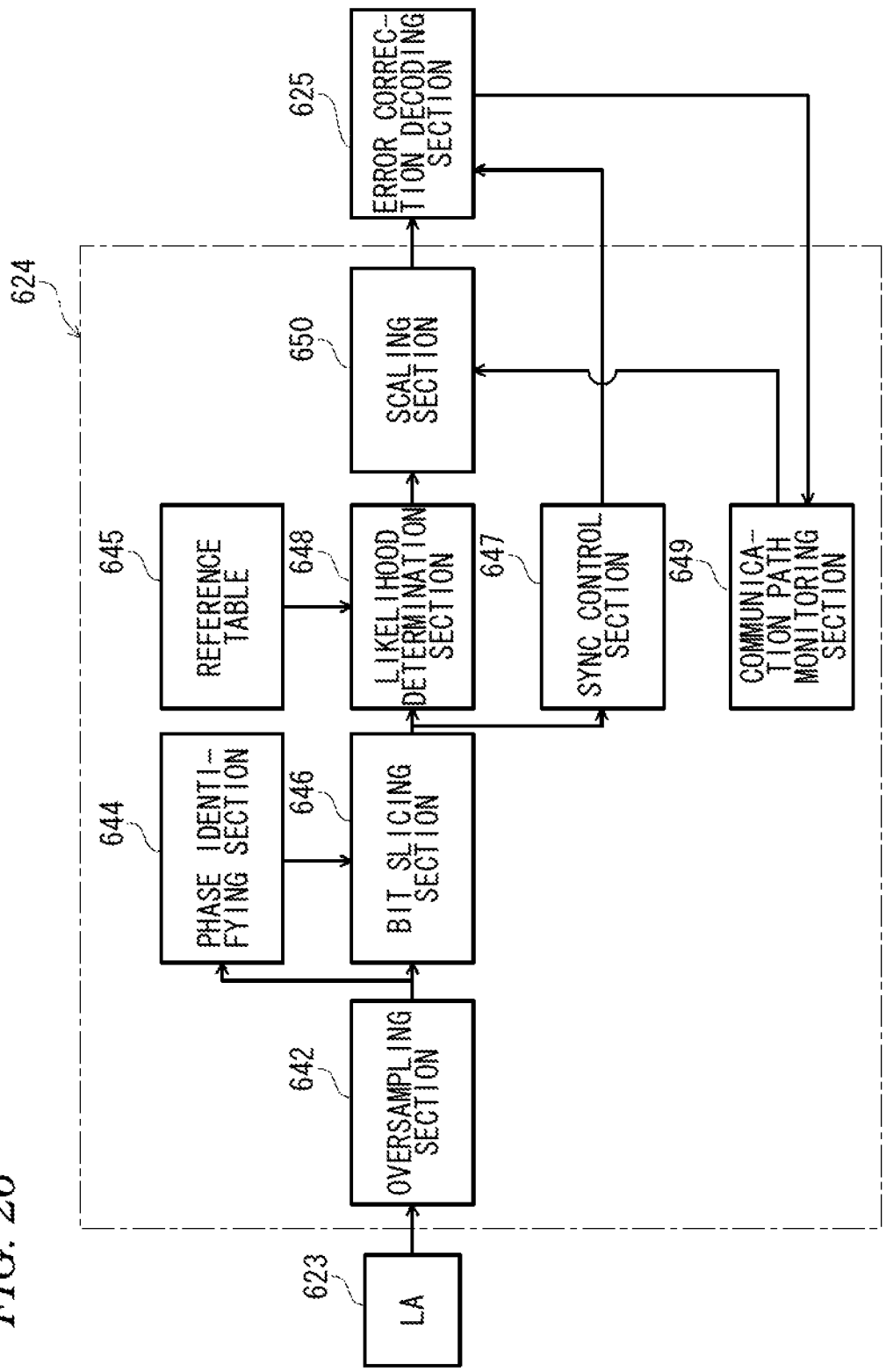
FIG. 26 is a block diagram showing a brief overview of Reference Patent Document 2.

With regard to the number of soft decision bits, a prior-art technique of changing (scaling) the number of soft, decision bits according to quality of a channel that works as a transmission path is disclosed in Reference Patent Document 1 and Reference Patent Document 2. FIG. 25 shows a brief overview of Reference Patent Document 1, and FIG. 26 shows a brief overview of Reference Patent Document 2.

According to Reference Patent Document 1, in order to determine a scale factor to be used as a function for a previously selected channel quality value 566, a soft value (a soft decision value) output from the demodulator 566 is fed to a processor (CPU) 544 by way of a decoder 558. The processor 544 returns a scaled soft value to the decoder 558. A scaling circuit included in an input terminal of the decoder 558 is circuitry used for executing processing pertaining to scale-dependent iterative decoding processes. To be specific, the scaling circuit is used for scaling a soft input value before the soft input value is subjected to processing pertaining to the iterative decoding process. The scaling factor is determined by resolving an equation with use of the processor 544.

According to Reference Patent Document 2, a communication path monitoring section 649 constantly calculates a bit error rate (BER) from a correction result output from an error correction decoding section 625, thereby monitoring a status of the communication path on the basis of the thus-calculated bit error rate at all times. In addition, the communication path monitoring section 649 determines a signal-to-noise ratio (SNR) of the communication path from the bit error rate, outputting the signal-to-noise ratio to a scaling section 650. The scaling section 650 determines, from the signal-to-noise ratio received from the communication path monitoring section 649, whether or not to multiply a log likelihood ratio λn output from a likelihood determination section 648 by a predetermined scaling factor. When the log likelihood ratio λn output from the likelihood determination section 648 should be multiplied by the predetermined scaling factor, the scaling section 650 multiplies the log likelihood ratio λn by the predetermined scaling factor, outputting a multiplication result to the error correction decoding section 625.

[Reference Patent Document 1] Japanese International Patent Publication 2006-515483

[Reference Patent Document 2] JP-A-2009-159037

However, according to Reference Patent Document 1, calculation of a scaling factor must be completed before an error correction is performed. Moreover, calculation of the scaling factor is complicate, and a long time elapses from start to end of calculation. In addition, even in relation to Reference Patent Document 2, a long time is consumed by processing that starts from measuring a bit error rate and ends with a determination of scaling of a soft decision value.

Since communication quality of a mobile terminal, like a cellular phone, varies with time, a scaling value must be reflected adaptively.

However, according to the related-art techniques, even when the transmission path exhibits superior communication quality, a long processing time is involved in determining a scaling value, so that difficulty is encountered in adaptively decreasing the number of bits to be processed by the error correction decoding circuit. For this reason, it has hitherto been difficult to reduce the electrical power consumption of the error correction decoding circuit by the calculation of the scaling value with the related-art configuration.

In light of the circumstances, the disclosure exemplifies a decoding device, a decoding method, and a wireless communication device that reduce a volume of received data to be decoded in accordance with communication quality of a transmission path, thereby decoding the data at high speed.

(Fifth Embodiment)

An example decoding device, an example decoding method, and an example wireless communication device are hereunder described as a fifth embodiment of the disclosure by reference to the drawings.

<Configuration of a Transceiver 300 that Works as the Wireless Communication Device>

Figure 14:
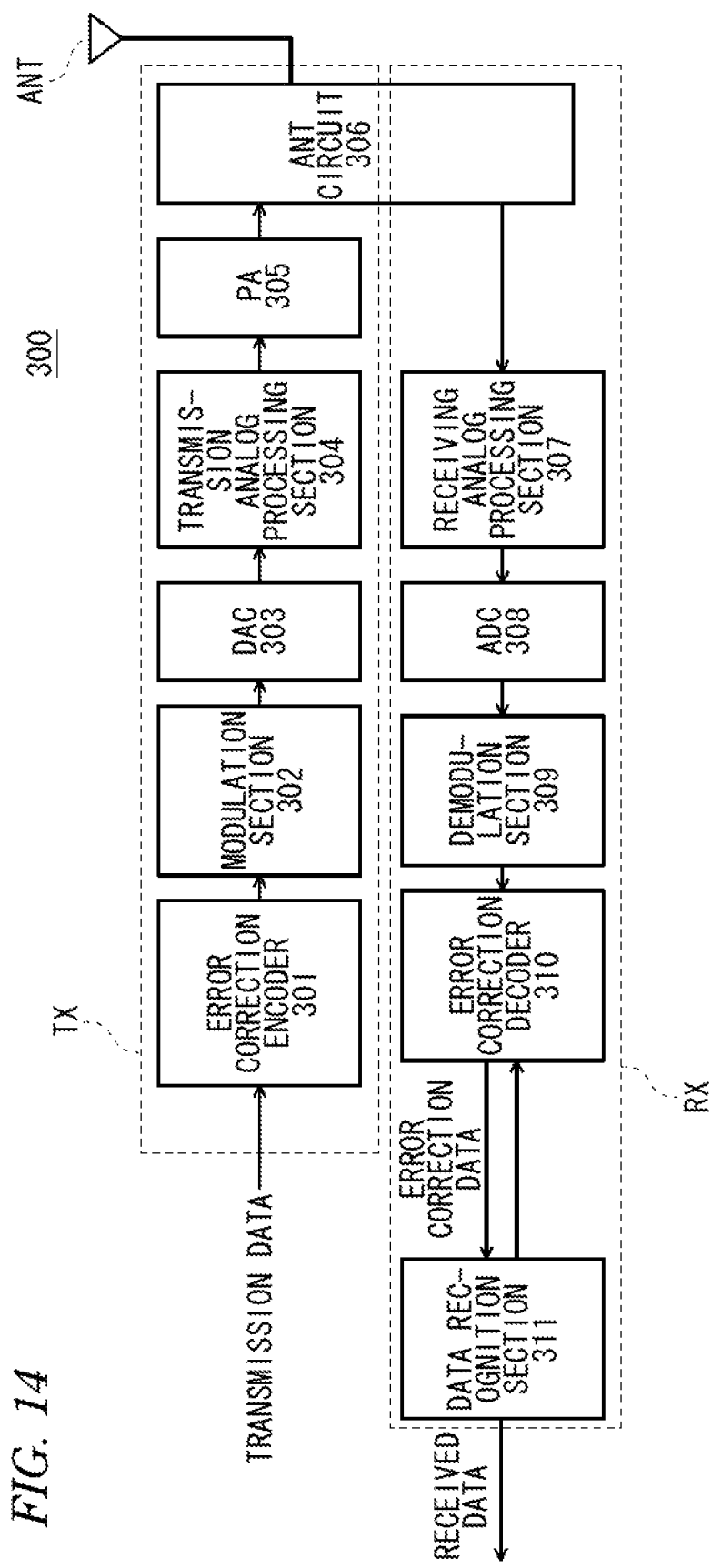
FIG. 14 is a block diagram showing an example configuration of a transceiver of a fifth embodiment.

FIG. 14 provides a block diagram that shows an example configuration of the transceiver 300 of the embodiment. The transceiver 300 that works as a wireless communication device includes a transmission section TX and a receiving section RX.

The transmission section TX of the transceiver 300 includes an error correction encoder 301, a modulator 302, a DAC (Digital Analog Converter) 303, a transmission analog processing section 304, a PA (Power Amplifier) 305, and an antenna (ANT) circuit 306 to which an antenna Ant is connected.

The receiving section RX of the transceiver 300 includes the antenna circuit 306 to which the antenna Ant is connected, a receiving analog processing section 307, an ADC (Analog Digital Converter) 308, a demodulation section 309, an error correction decoder 310, and a data recognition section 311. The antenna Ant is made by use of; for instance, an antenna element. Moreover, the antenna circuit 306 to which the antenna Ant is connected can also belong to either the transmission section TX or the receiving section RX.

<Operation of the Transceiver 300 Performed when it Transmits a Wireless Signal>

The error correction encoder 301 adds an error correction code [for instance, a parity code generated from a low density parity check (LDPC) code serving as an error correction check code] to the transmission data. The transmission data to which the parity code is added by the error correction encoder 301 are input to the modulator 302.

The modulator 302 modulates the thus-input transmission data in accordance with a modulation scheme that is previously shared by another (unillustrated) receiver. Types of the modulation schemes include; for instance, BPSK (Binary Phase Shift Keying), QPSK (Quadrature Phase Shift Keying), and 16 QAM (Quadrature Amplitude Modulation). The transmission data modulated by the modulator 302 are input to the DAC 303.

The DAC 303 converts the transmission data formed from a digital signal into an analog signal. The analog signal output from the DAC 303 is input to the PA 305 after being input to the transmission analogue processing section 304 and undergoing predetermined signal processing (e.g., processing for up-converting a baseband signal to a high frequency signal).

The PA 305 amplifies electrical power of the thus-input analog signal, outputting the thus-amplified analog signal to the antenna circuit 306. Accordingly, a wireless transmission signal (a radio wave) is output from the antenna circuit 306 by way of the antenna Ant.

<Operation Performed by the Transceiver 300 when it Receives the Wireless Signal>

A wireless signal transmitted from another transmitter (unillustrated) is received by the antenna circuit 306 by way of the antenna Ant and input as a received signal into the receiving analog processing section 307. The receiving analog processing section 307 subjects the thus-input received signal to predetermined signal processing (e.g., down-conversion processing for converting the high frequency signal to a baseband signal and AGC (Automatic Gain Control) processing). The received signal processed by the receiving analog processing section 307 is input to the ADC 308.

The ADC 308 converts the received signal, which is input as an analog signal, into a digital signal, outputting the digital signal as received data. The modulation section 309 demodulates the received data input from the ADC 308, in accordance with the predetermined modulation scheme (e.g., BPSK, QPSK, and 16QAM) that is previously shared with the other transmitter (not shown).

The received data demodulated by the demodulation section 308 are input to the error correction decoder 310 that serves as the decoding device of the embodiment. The error correction decoder 310 subjects the input received data to error correction decoding, outputting the received data that have undergone error correction decoding to the data recognition section 311.

The received data that are output from the error correction decoder 310 and have undergone error correction are input to the data recognition section 311, where data required to control the transceiver 300 are recognized. For instance, the data recognition section 311 recognizes information which is included in the header of the received data and is pertinent to a method for modulating the payload and a coding rate, generating timing required to control the transmitter 300 on the basis of a guard interval (GI).

Details of the configuration and operation of the error correction decoder 310 that serves as the decoding device of the embodiment are hereunder described.

<Configuration of an Error Correction Receiver 400 that Serves as a Decoding Device (the Error Correction Decoder 310)>

Figure 15:
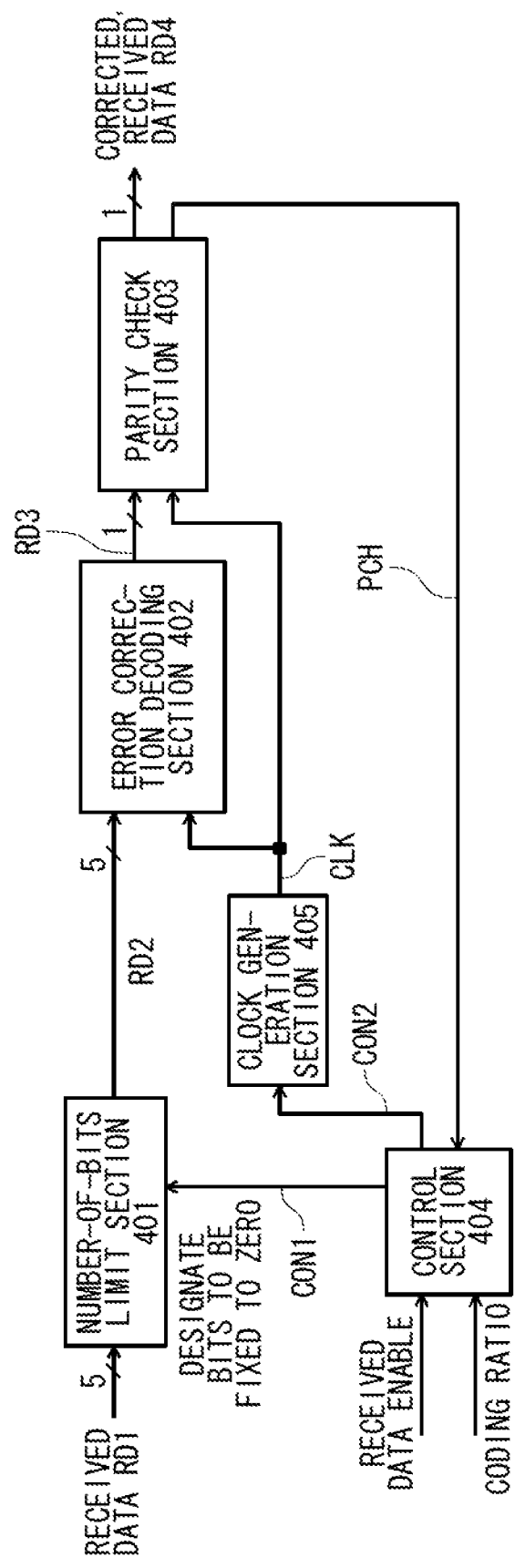
FIG. 15 is a block diagram showing an example configuration of an error correction receiver of the fifth embodiment.

FIG. 15 shows an example configuration of the error correction receiver 400 of the embodiment. The error correction receiver 400 shown in FIG. 15 is equivalent to the error correction decoder 310 shown in FIG. 14.

The error correction receiver 400 includes a number-of-bits limit section 401, an error correction decoding section 402, a parity check section 403, a control section 404, and a clock generation section 405.

The received data that serve as an output from the demodulation section 309 shown in FIG. 14 are input to the number-of-bits limit section 401. The received data correspond to a soft decision value that represent a likelihood of 0s and 1s of the bit data. In the embodiment, received data RD1 are input as a 5-bit parallel signal to the number-of-bits limit section 401. In this respect, the number of bits of the received data RD1 can also be changed as necessary.

The number-of-bits limit section 401 limits an effective number of bits of received data RD2 input as a soft decision value to the error correction decoding section 402. Specifically, the number-of-bits limit section 401 outputs as the received data RD2 a result that is yielded by fixing to zero respective bits, except the highest order bit, of a parallel signal regarding the input 5-bit received data RD1. For instance, a signal that is the same as the signal of the received data RD1 except fixed bits is output for the five bits of the received data RD2. Or, the signal is output after bits fixed to zero in the signal are rounded off.

Bits fixed by the number-of-bits limit section n401 are determined in accordance with a control signal CON1 output from the control section 404. Specifically, the number-of-bits limit section 401 switches the input received data that are made of the 5-bit parallel signal to any one of statues; namely, a status in which the lowest order bit of the received data RD2 is fixed, a status in which two lower order bits are fixed, a status in which three lower order bits are fixed, a status in which four lower order bits are fixed, and a status in which all bits are not fixed (i.e., identical with the status of the received data RD1).

The number-of-bits limit section 401 making a change to the effective number of bits of the received data RD2 that are input to the error correction decoding section 402 is synonymous with scaling the soft decision value. To be specific, if the effective number of bits of the received data RD2 is increased, the error correction capability of the error correction decoding section 402 will be enhanced. In contrast, if the effective number of bits is decreased, the error correction capability of the error correction decoding section 402 will fall.

The received data RD2 are input as a soft decision value to the error correction decoding section 402. By iterating predetermined decoding operation; namely, by performing iterative decoding, the error correction decoding section 402 corrects an error in the received data. The number of decoding iterations can also be changed as required. A processing result yielded by the error correction decoding section 402 is input to the parity check section 403 as received data RD3 of a 1-bit signal. Further, the error correction decoding section 402 operates in synchronism with a clock pulse CLK that has a constant frequency and that is fed from the clock generation section 405.

The parity check section 403 that serves as a data error detection section is sequentially provided with the received data RD3 output from the error correction decoding section 402. The parity check section 403 subjects the received data to a parity check, thereby identifying whether or not an error exists in the data which are a result of error correction processing performed by the error correction decoding section 402.

The parity check section 403 outputs to the control section 404, as a parity check result, a signal PCH that represents absence or presence of a data error. The corrected, received data RD4 output from the parity check section 403 are a 1-bit signal that is the same as the signal of the received data RD3 output from the error correction decoding section 402. The parity check section 403 operates in synchronism with the dock pulse CLK that is fed from the dock generation section 405 and that has a constant cycle.

A "received data enable" signal and a "coding ratio" signal that are output from the data recognition section 311 shown in FIG. 14 are input to the control section 404. The "received data enable" signal is a timing signal that represents a valid duration of the received data and that are generated, by the data recognition section 311, from a guard interval in the received signal. Further, the "coding ratio" signal is information included in a header region of the received signal.

The control section 404 grasps the number of decoding iterations in the error correction decoding section 402 and also presence or absence of a data error on the basis of the signal PCH. Since a time required for the error correction decoding section 402 to perform one decoding operation is constant, the control section 404 grasps the number of decoding iterations in the error correcting decoding section 402 on the basis of the time elapsed from initiation of decoding operation.

On the basis of the number of decoding iterations in the error correction decoding section 402 and the presence or absence of a data error grasped from the signal PCH, the control section 404 determines an effective number of bits of the received data RD2 to be limited by the number-of-bits limit section 401, outputting a control signal CON1 equivalent to the effective number of bits. Upon receipt of a header region of the received signal (received data), the control section 404 determines an effective number of bits by monitoring an operating status of the error correction decoding section 402; namely, quality of the transmission path.

The control section 404 also controls an output of a control signal CON2, thereby halting a feed of the clock pulse CLK output from the clock generation section 405 or resuming the feed of the clock pulse CLK. Specific operation of the control section 405 will be described later.

<Example Configuration of the Error Correction Decoding Section 402>

Figure 16:
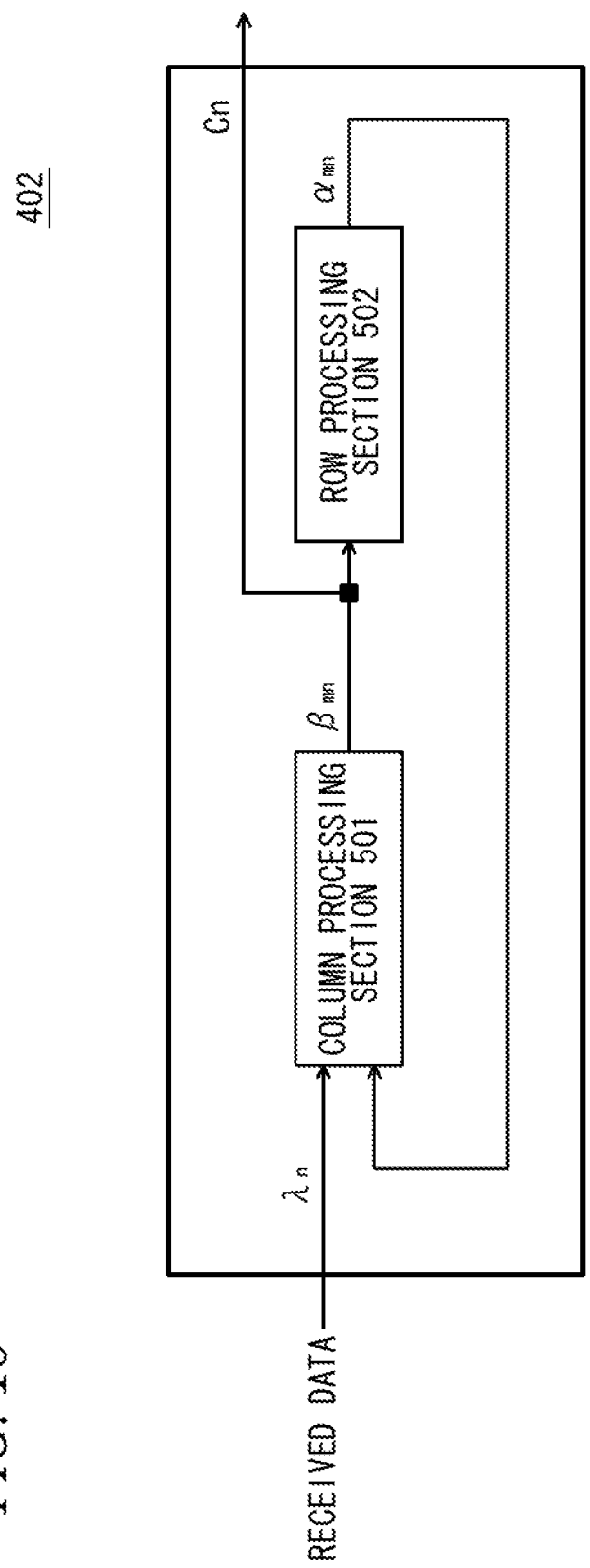
FIG. 16 is a block diagram showing an example configuration of an error correction decoding section.

FIG. 16 shows an example configuration of the error correction decoding section 402 in the error correction receiver 400 shown in FIG. 15. Specifically, when the known min-sum decoding technique is used as the method for decoding the LDPC code, the error correction decoding section 402 can be configured with a circuit shown in FIG. 16.

The error correction decoding section 402 includes a column processing section 501 and a row processing section 502. Each of the processing sections performs arithmetic operation according to foregoing Mathematical Expressions (3) and (4). To be specific, although unillustrated, an interior of each of the column processing section 501 and the row processing section 502 is configured by use of an adder and a comparator that searches for a minimum value.

Therefore, when respective bits of the received data RD2 keep assuming zero without modifications, no change occurs in a status of the circuit that processes the bit. For instance, an output bit will remain unchanged if the input bit keeps assuming a numeral of 0 without modifications because a result of addition of 0 to 0 is 0. Since the circuit that processes the bit stays inoperative, electric power which would be dissipated by the circuit of the error correction coding section 402 can be significantly reduced. In Mathematical Expressions (3) and (4), reference symbol "m" denotes a row number; "n" denotes a column number; and "ω" denotes a real number of one or less.

The error correction decoding section 402 using the "min-sum decoding method" can yield an error rate characteristic that is tantamount to that of the "sum-product algorithm," provided that a value of the order of 0.8 is given to ω of; for instance, Mathematical Expression (4). In this respect, a value of 0.8 is a mere example, and an optimum value depends on the check matrix H.

<Example Operation Timing of the Error Correction Receiver 400>

Figure 17:
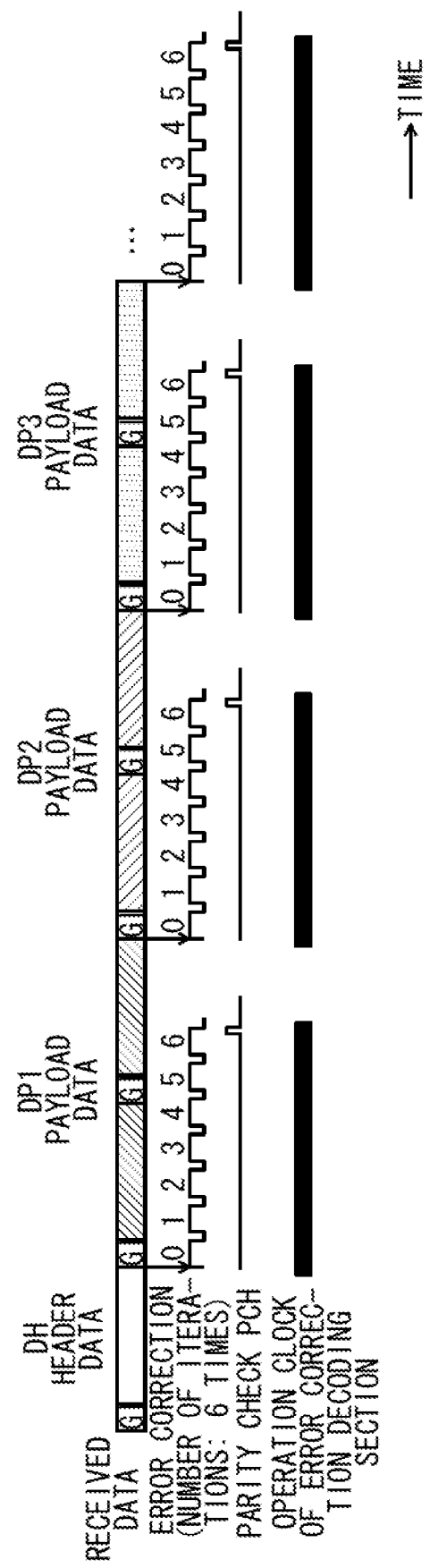
FIG. 17 is a timing chart showing example operation of the error correction receiver that is performed when a transmission path exhibits poor quality.
Figure 18:
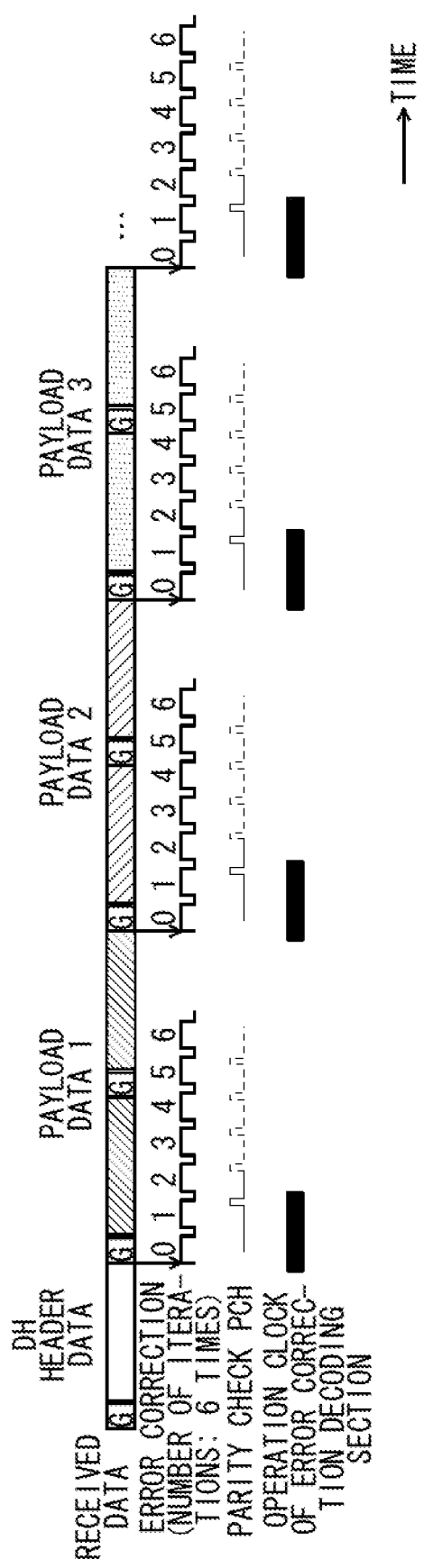
FIG. 18 is a timing chart showing example operation of the error correction receiver that is performed when quality of the transmission path is superior to that exhibited in FIG. 17.
Figure 19:
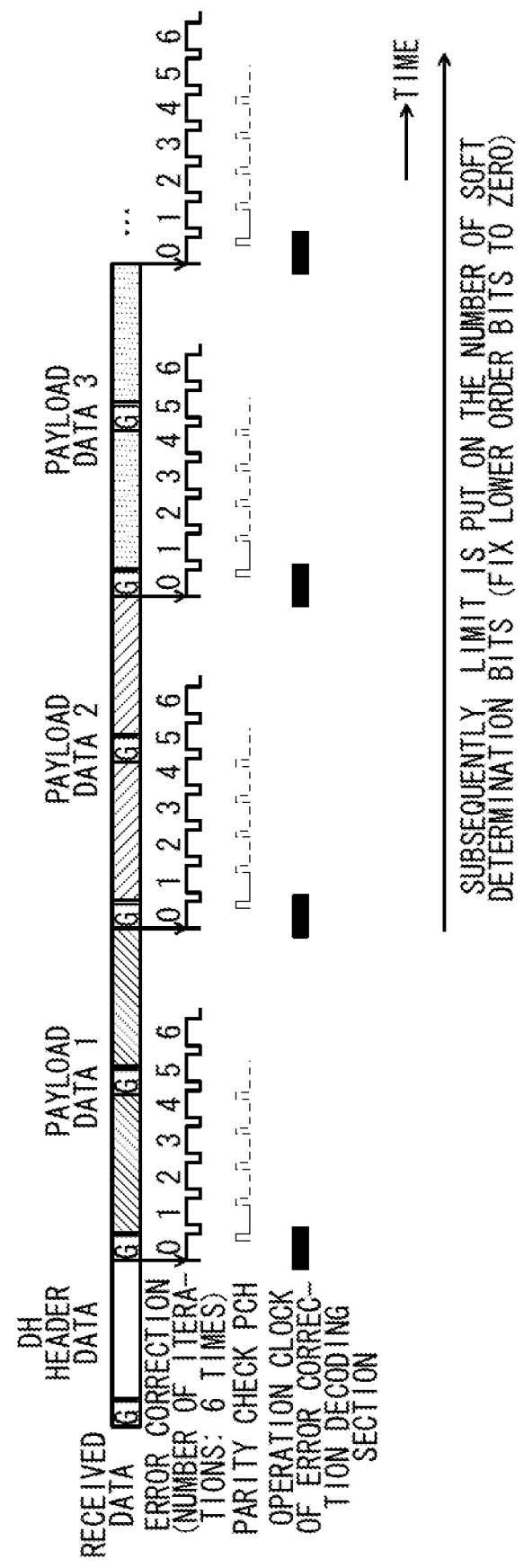
FIG. 19 is a timing chart showing example operation of the error correction receiver that is performed when quality of the transmission path is superior to that exhibited in FIG. 18.

FIG. 17, FIG. 18, and FIG. 19 show specific example timings pertaining to operation of the error correction receiver 400. FIG. 17 is a timing chart showing example operation of the error correction receiver 400 performed when the transmission path has low quality. FIG. 18 is a timing chart showing example operation of the error correction receiver 400 performed when the quality of the transmission path is superior to that shown in FIG. 17. FIG. 19 is a timing chart showing example operation of the error correction receiver 400 performed when the quality of the transmission path is superior to that shown in FIG. 18.

The embodiment is based on, by way of example, the presumption that the error correction receiver 400 receives received data with a frame format shown in FIG. 17. More specifically, the received data include header data DH and sequentially-appearing payload data; i.e., first payload data DP1, second payload data DP2, third payload data DP3, . . . .

The header data DH hold information for managing data to be exchanged by the transceiver 300. To be specific, the header data hold information about a method for modulating a payload that stores data body and a coding ratio. The method for modulating a header of received data is previously shared between the transceiver 300 and another transceiver (not shown). In addition, the guard interval (GI) serving as a known signal is interposed between sets of data in the frame format.

Operation of individual sections of the error correction receiver 400 is now described.

When the control signal CON1 output from the control section 404 is not input to the number-of-bits limit section 401, the received data RD1 output from the demodulation section 309 are output as the received data RD2 to the error correction decoding section 402. The error correction decoding section 402 inputs the received data RD2, thereby iterating error correction decoding operation. The error-corrected, received data RD3 are output every single performance of error correction decoding operation.

The parity check section 403 subjects the input, error-corrected, received data RD3 to a parity check. If a syndrome comes to zero, the parity check section 403 determines that no data error exists in the error-corrected, received data RD3, outputting the signal PCH showing that the parity check is OK.

The error correction decoding section 402 shown in FIG. 15 has a ceiling on the number of iterations of error correction decoding. For instance, in the example operations shown in FIG. 17 to FIG. 19, the maximum number of iterations of error correction decoding is set to six.

The example operation shown in FIG. 17 is based on the premise of a low-quality transmission path. Therefore, a parity check turns into OK when the number of iterations reaches a maximum number of six. In this regard, an iteration number of zero represents a status in which an error correction is not practiced.

Therefore, in FIG. 17, when the error correction decoding section 402 iterates error correction decoding many a time until the parity check result becomes OK, the quality of the transmission path can be determined to be poor. A limit which the control signal CON1 would put on the effective number of bits is not placed. In other words, the number-of-bits limit section 401 outputs the received data RD1 output from the demodulation section 309 as the received data RD2 to the error correction decoding section 402.

In the meantime, in the example operation shown in FIG. 18, the parity check already shows OK when the number of iterations of error correction decoding is one. Specifically, since the transmission path exhibits comparatively superior quality, the error correction decoding section 402 can decode data-error-free received data by means of error correction decoding of the first time.

When the parity check turns into "OK." the clock generation section 405 halts a feed of the clock pulse CLK to the error correction decoding section 402 according to the control signal CON2 output from the control section 404. Since the error correction decoding section 402 is in operation in synchronism with the clock pulse CLK, circuit operation of the error correction decoding section 402 also comes to a halt when the feed of the clock pulse CLK is stopped. Specifically, when the parity check shows OK at an early stage, the feed of the clock pulse CLK is halted, so that the error correction receiver 400 can reduce electrical power which would be consumed by the error correction decoding section 402.

In the example operation shown in FIG. 19, the parity check already shows OK when the number of iterations of error correction decoding is zero. To be specific, since the error correction decoding section 402 can have decoded data-error-free received data before performing error correction decoding, the quality of the transmission path is superior.

Even in the example operation shown in FIG. 19, the clock generation section 405 stops feeding the clock pulse CLK to the error correction decoding section 402 according to the control signal CON2 from the control section 404 since the parity check became OK, thereby halting circuit operation of the error correction decoding section 402.

<Limit on Effective Number of Bits>

In the example operation shown in FIG. 18 or FIG. 19, quality of the transmission path is superior; and even when correction capability of the error correction decoding section 402 is deteriorated, there is a high probability that an appropriate error correction result will be acquired. In short, the number-of-bits limit section 401 can put a limit on the effective number of bits of the received data RD2 input to the error correction decoding section 402.

The control section 404 determines an effective number of bits, controlling operation of the number-of-bits limit section 401 by use of the control signal CON1. An extent to which the effective number of bits can be limited is determined according to quality of the transmission path. In FIG. 17 to FIG. 19, a high correspondence exists between the number of decoding iterations performed until parity check OK is detected and the quality of the transmission path. Accordingly, the control section 404 brings the number of decoding iterations performed until parity check OK is detected in correspondence with an effective number of bits, thereby determining an effective number of bits.

<Descriptions about an Effective-Number-of-Bits Table>

The control section 404 holds an effective-number-of-bits table and determines an effective number of bits by use of the effective-number-of-bits table. The control section 404 can thereby efficiently determine an effective number of bits that the number-of-bits limit section 401 limits. FIG. 20 and FIG. 21 show specific example configurations of respective effective-number-of-bits tables.

An effective-number-of-bits table TBL1 shown in FIG. 20 is different from an effective-number-of-bits table TBL2 shown in FIG. 21 in terms of specifics. Any one of the effective-number-of-bits tables TBL1 and TBL2 can be used, or the effective-number-of-bits tables TBL1 and TBL2 can also be selectively used according to a quality status of the transmission path. In addition, specifics of the effective-number-of-bits table can also be stored in memory (e.g., nonvolatile memory) disposed within the control section 404, or the control section 404 can also rewrite the specifics as required.

The effective-number-of-bits table TBL1 shown in FIG. 20 includes the following four types of data DT1, DT2, DT3, and DT4. Specifically the data DT1 represent the number of decoding iterations performed until parity check OK is detected. The data DT2 represent the number of soft decision bits. The data DT3 represent an effective number of bits. The data DT4 represent the number of bits to be fixed to zero.

Minimum required information in the effective-number-of-bits table TBL1 is the data DT1 and the data DT3 or the data DT4. To be specific, by reference to the effective-number-of-bits table TBL1 shown in FIG. 20, the control section 404 can bring the number of decoding iterations allocated to the data DT1 in correspondence with the effective number of bits allocated to the data DT3 or the data DT4.

<Specific Example Pertinent to Determination of an Effective Number of Bits>

A specific example of a case where the effective-number-of-bits table TBL1 is used is now described. For instance, in the example operation shown in FIG. 19, during decoding of the header data DH, the parity check turns into OK with the number of decoding iterations at 0. By reference to the "$0^{th}$ time" for the data DT1 in the effective-number-of-bits table TBL1, the control section 404 recognizes specifics of the data DT3 corresponding to the "$0^{th}$ time" for the data DT1 as "one bit," determining the effective number of bits as "one bit."

The control section 404 imparts as the control signal CON1 information that shows that the effective number of bits is "one bit" to the number-of-bits limit section 401. The number-of-bits limit section 401 thereby fixes to zero each of four lower order bits in the received data RD2 that are made up of five parallel signals, taking highest order one bit as an effective bit.

Consequently, in the example operation shown in FIG. 19, when the received data of the payload data DP1 subsequent to the head data DH are decoded, the effective number of bits of the received data RD2 input to the error correction decoding section 402 comes to one bit. Specifically, even when a change occurs in the 5-bit received data RD1 that are the soft decision value, the four lower order bits in the five bits that make up the received data RD2 remain unchanged.

Moreover, in the example operation shown in FIG. 18, the parity check already shows OK when the number of iterations of decoding is one during decoding of the header data HD. By reference to the "first time" for the data DT1 of the effective-number-of-bits table TBL1, the control section 404 ascertains that specifics of the data DT2 corresponding to the "first time" for the data DT1 is "two bits," determining the effective number of bits as "two bits."

The control section 404 imparts as the control signal CON1 information showing that the effective number of bits is "two bits" to the number-of-bits limit section 401. The number-of-bits limit section 401 thereby fixes to "zero" each of three lower order bits in the received data RD2 that are made up of the five-bit parallel signal, taking remaining two high order bits as effective bits.

<Descriptions about the Operation Flow of the Error Correction Receive 400>

Figure 22:
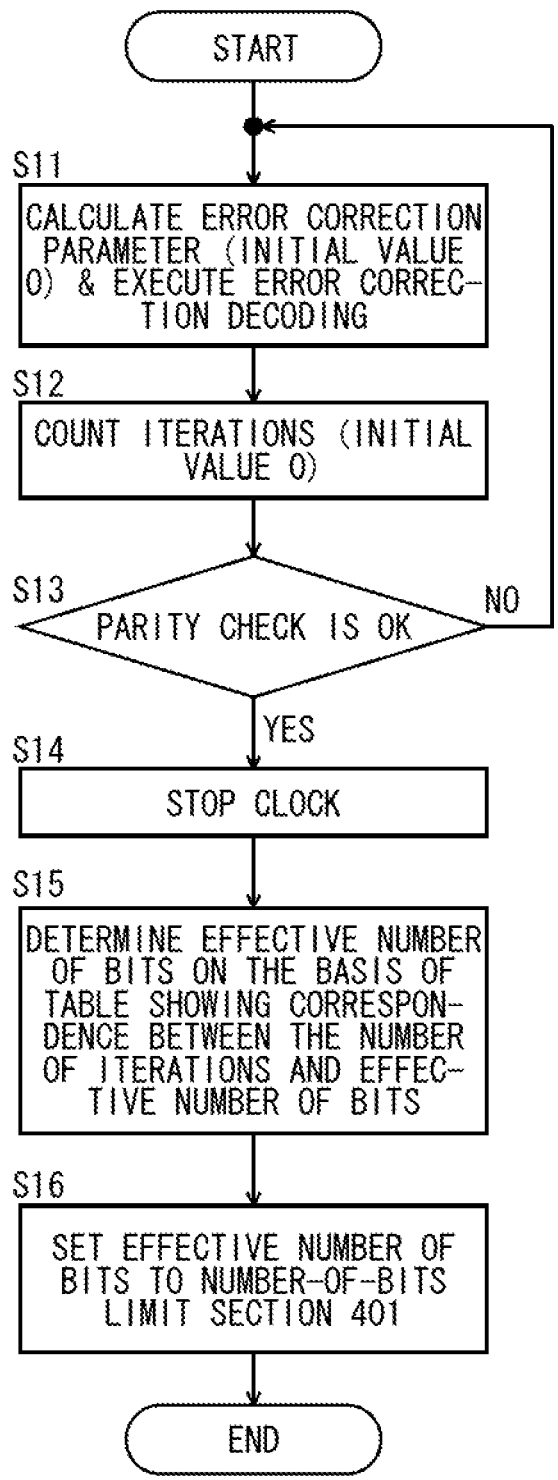
FIG. 22 is a flowchart for explaining operation of an error correction decoder with respect to a header.
Figure 23:
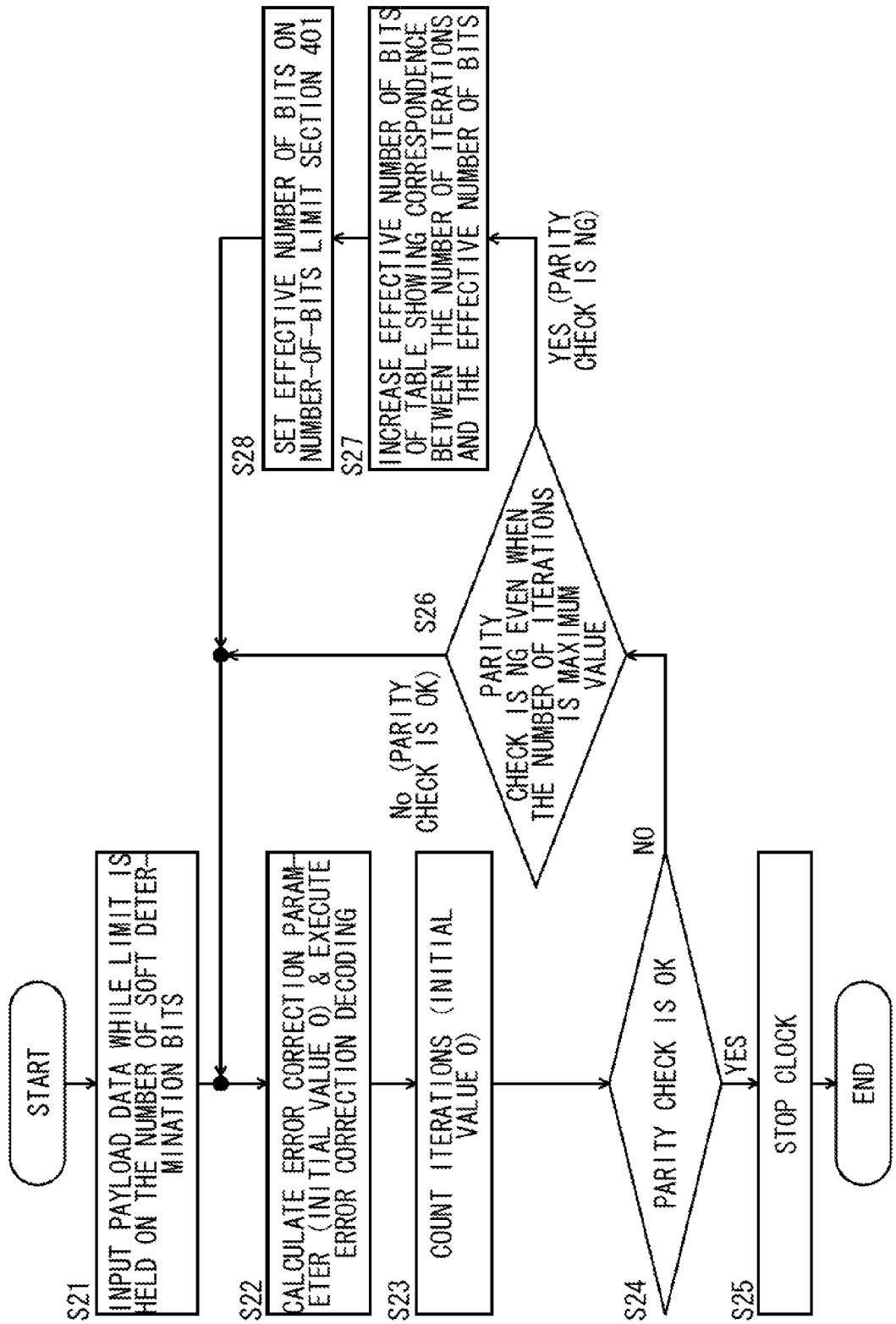
FIG. 23 is a flowchart for explaining operation of the error correction decoder with respect to a payload.

FIG. 22 shows a flowchart for explaining operation of the error correction receiver 400 targeted for the header. FIG. 23 shows a flowchart for explaining operation of the error correction decoder targeted for a payload. Specifically, under control of the control section 404, control is sequentially practiced along procedures shown in FIG. 22 and FIG. 23.

When the header data DH appear as the received data RD1, processing pertaining to steps S11 to 316 shown in FIG. 22 is performed. Further, when payload data (DP1, DP2, . . . ) appear, processing pertaining to steps S21 to S28 shown in FIG. 23 is performed.

<Operation Performed when the Head Data DT are Decoded>

The number-of-bits limit section 401 does not pose a limit on the effective number of bits of the received data RD2. Specifically the 5-bit received data RD1 are input as the received data RD2 to the error correction decoding section 402.

The error correction decoding section 402 calculates an error correction parameter, subjecting the received data RD2 to error correction decoding. An initial value of the error correction parameter is zero. Accordingly, the error correction decoding section 402 performs decoding without making a correction at the first time; namely, the "$0^{th}$ time" in FIG. 17 to FIG. 19 (S11).

The control section 404 counts the number of iterations of error correction decoding performed by the error correction decoding section 402 (S12). An initial value of the number of iterations is set to zero. Since the time required for one error correction decoding operation is previously determined, the control section 404 counts the number of iterations of error correction decoding performed by the error correction decoding section 402 in accordance with the time that elapses since error correction decoding was initiated.

Every time the error correction decoding section 402 performs one decoding operation, the control section 404 monitors the signal PCH, or the parity check result which is generated by subjecting the decoding result to a parity check by the parity check section 403, thereby determining whether or not the parity check is OK (S13).

When a data error exists in the received data RD3 output from the error correction decoding section 402 (NO in S13), the parity check is NG; hence, operation of the error correction receiver 400 returns from step S13 to step S11. Specifically, the error correction decoding section 402 iterates error correction decoding a number of times (S11). Further, the control section 404 counts the number of iterations (S12).

When the parity check becomes OK (YES in S13), the control section 404 outputs the control signal CON2 to the clock generation section 405, thereby letting the clock generation section 405 halt the feed of the clock pulse CLK to the error correction decoding section 402 and the parity check section 403 (S14). Operation of the error correction decoding section 402 and operation of the parity check section 403 are thereby halted.

When the parity check becomes OK (YES in S13), the control section 404 determines the number of effective bits by use of the number of iterations of error correction decoding and by reference to the effective-number-of-bits table TBL 1 (S15). The control section 404 outputs the control signal CON1, and the number-of-bits limit section 401 sets the effective number of bits to be limited (S16).

<Operation Performed when Payload Data (DP1, DP2, . . . ) are Decoded>

The number-of-bits limit section 401 poses a limit on the effective number of bits in step 316 shown in FIG. 22. Hence, when the error correction receiver 400 receives the payload data, the received data RD2 with the limited effective number of bits are input to the error correction decoding section 402 (S21).

The error correction decoding section 402 calculates an error correction parameter, subjecting the received data RD2 to error correction decoding. An initial value of the error correction parameter is zero. Accordingly, the error correction decoding section 402 performs decoding without making corrections at the first time; namely, the "$0^{th}$ time" in FIG. 17 to FIG. 19 (S22).

The control section 404 counts the number of iterations of error correction decoding performed by the error correction decoding section 402 (S23). An initial value of the number of iterations is set to zero. Since the time required for one error correction decoding operation is previously determined, the control section 404 counts the number of iterations of error correction decoding performed by the error correction decoding section 402 in accordance with the time that elapses since error correction decoding was initiated.

Every time the error correction decoding section 402 performs one decoding operation, the control section 404 monitors the signal PCH, or the parity check result which is generated by subjecting the decoding result to a parity check by the parity check section 403, thereby determining whether or not the parity check is OK (S24).

When a data error exists in the received data RD3 output from the error correction decoding section 402 (NO in 324), the parity check turns into NG; hence, operation of the error correction receiver 400 returns from step S14 to step S22 by way of step S26. Specifically, the error correction decoding section 402 iterates error correction decoding a number of times (S22). Further, the control section 404 counts the number of iterations (S23).

Further, when the parity check is NG (NO in S24), the control section 404 identifies whether or not the parity check is NG even when the number of iterations has come to the preset maximum value (for instance six times) (S26). When the parity check still remains NG even when the number of iterations has reached the maximum number (YES in S26) the control section 404 changes the effective number of bits to another effective number of bits that is greater than the previous effective number of bits by again reference to the effective-number-of-bits table TBL1 or TBL2 (S27). The control section 404 outputs the control signal CON1, setting the effective number of bits changed in step S27 as the effective number of bits to be limited by the number-of-bits limit section 401 (S28).

A status in which the effective number of bits is limited in step S16 is a situation where the quality of the transmission path is superior. Accordingly, even when the number-of-bits limit section 401 poses a limit on the effective number of bits, the parity check becomes OK before the number of iterations of error correction coding reaches the maximum number. Therefore, steps S26 to S28 are not always necessary.

However, in some cases, it is also conceivable that the quality of the transmission path will become suddenly deteriorated. When the quality of the transmission path becomes deteriorated, the control section 404 increases the effective number of bits in steps S27 and S28, whereby the error correction capability of the error correction decoding section 402 can be enhanced. The error correction receiver 400 can thereby decode received data in response to a dynamic change in the quality of the transmission path.

<Verification of Effectiveness of Operation of the Error Correction Receiver 400>

Figure 24:
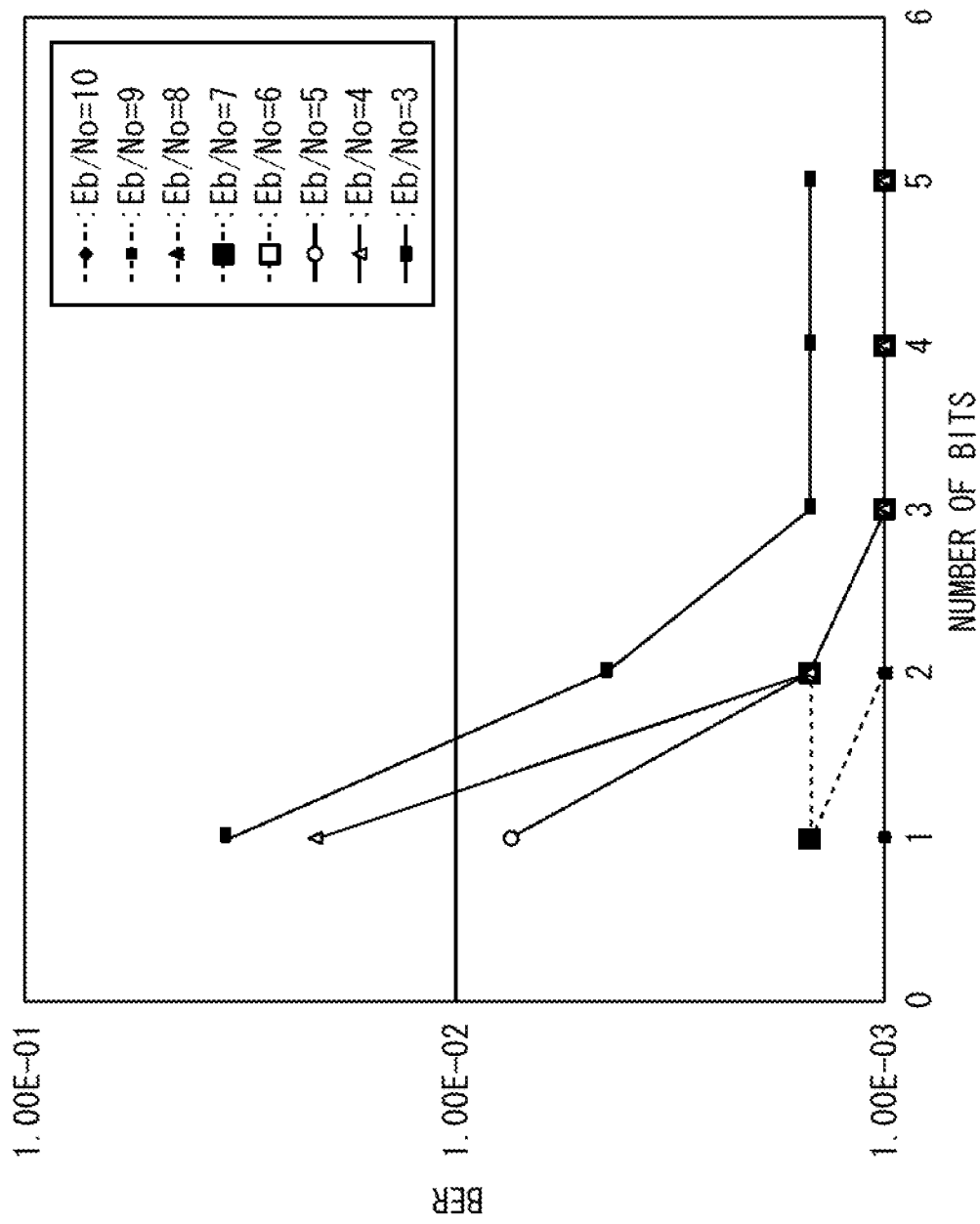
FIG. 24 is a graph showing a relationship between an effective number of bits of a soft decision value and an error rate (BER).

FIG. 24 shows a correspondence between the effective number of bits of the soft decision value and the error rate (BER). Specifically, FIG. 24 shows results of simulation of correspondence between an error rate (BER) of a noise ratio (Eb/No) per bit and the number of soft decision bits of the received data RD2.

In FIG. 24, when noise is large (Eb/No=3), the error rate becomes deteriorated by reducing the number of soft decision bits to two bits or one bit. In the meantime, when noise is small (Eb/No=9, Eb/No=10), the error rate is understood to be substantially constant even when the number of soft decision bits is reduced from five bits to one bit.

Specifically, in a situation in which the quality of the transmission path is superior with a small amount of noise, the error rate remains unchanged even the number of soft decision bits is reduced from five bits to one bit, and the same error correction decoding result is yielded. Accordingly, the effective number of bits of the soft decision value of the received data RD2 input to the error correction decoding section 402 can also be reduced.

Therefore, in relation to: for instance, the effective-number-of-bits table TBL1 shown in FIG. 20, when the parity check turns into OK and when the number of iterations of decoding DT1 is small, the control section 404 determines that the quality of the transmission path is superior, so that the effective number of bits DT3 can be reduced.

In other words, the control section 404 can determine, as required, an appropriate effective number of bits by use of the effective-number-of-bits table TBL1. In the example shown in FIG. 19, when the parity check becomes OK with the number of iterations at zero, the number-of-bits limit section 401 fixes four lower order bits of the received data RD2 to zero. Since four of the five bits of the data calculated by the error correction decoding section 402 are fixed to zero, power consumption can be reduced.

In order to decode an LDPC code, the error correction decoding section 402 uses a sum product (sum-product) decoding method or another decoding method that is a simplified form of the sum product decoding method (e.g., a minimum sum (min-sum) decoding method). An internal circuit of the error correction decoding section 402 is primarily made up of an adder.

Accordingly, when a signal that is a processing target and that includes a plurality of bits includes bits fixed to zero, circuitry for processing the thus-fixed bits becomes obviated. Therefore, the electric power consumed by the circuit of the error correction decoding section 402 is reduced.

In FIG. 22, since the control section 404 determines the effective number of bits when the header of the received data is processed, the effective number of bits can be reduced during processing of the payload including data body. An effect of reducing power consumption is enhanced.

As above, the error correction receiver 400 of the embodiment changes the effective number of bits for the number of soft decision bits in accordance with parity check results corresponding to the number of iterations performed by the error correction decoding section 402. The operating circuit of the error correction decoding section 402 can thereby be reduced, so that the electric power consumed by the transceiver 300 including the error correction receiver 400 can be reduced. When the number of iteration is small, the quality of the transmission path is superior. Therefore, the effective number of bits is limited by fixing the lower order bits of the received data RD2 to zero. The amount of received data to be decoded is thereby reduced according to the communication quality of the transmission path, whereby the received data can be decoded at high speed.

When the transmission path exhibits extremely superior quality, the error correction receiver 400 can further reduce power consumption by halting operation of the error correction coding section 402 and operation of the parity check section 403 as well as reducing power consumption by halting the clock.

(Brief Overview of One Mode of Disclosure)

A decoding device of a first disclosure includes a storage section that stores a plurality of likelihoods generated by demodulation of a received packet and a decoding section that has a plurality of decoding cores for decoding the likelihoods in parallel on a per-likelihood basis by use of respective partial check matrices into which an check matrix used for decoding is divided, wherein the partial check matrices are matrices having rows that are equal or greater in number to or than columns.

A decoding device of a second disclosure is based on the decoding device of the first disclosure and comprises an MCS information acquisition section that acquires MCS information about the received packet and a clock output section that selectively outputs a clock signal for operating the decoding cores, wherein, according to the MCS information, the clock output section feeds the clock signal to decoding cores that are smaller in number than the decoding cores which feed the clock signal during high speed communication when a communication method for transmitting the received packet is predetermined low speed communication that is slower than predetermined high speed communication.

A decoding device of a third disclosure is based on the decoding device of the first disclosure and comprises an MCS information acquisition section that acquires MCS information about the received packet; a clock output section that outputs, according to a level of multi-level modulation scheme included in the MCS information, either a first dock signal used for normal operation of the decoding cores or a second clock signal that is slower than the first clock; and a power source section that, according to the level of multi-level modulation scheme included in the MCS information, outputs a first power source of normal operating voltage to be fed to the decoding section when the clock output section outputs the first clock signal and outputs a second power source which is lower than the normal operating voltage when the clock output section outputs the second clock signal.

A decoding device of a fourth disclosure is based on the decoding device of the third disclosure, wherein the power source section notifies the other end of communication of information about allowable communication speed of a communication device of a user at an initial phase of communication with the other side of communication and previously outputs a low voltage power of the second power source when the other end of communication is notified that low speed communication with a low level of multi-level modulation is allowed.

A decoding device of a fifth disclosure is based on the decoding device of the fourth disclosure, further comprising a setting section that inputs user-oriented information about communication speed or power consumption, wherein the clock output section selects a clock signal to be output according to the user-oriented information, and the power source section selects a voltage to be output according to the user-oriented information.

A decoding device of a sixth disclosure is based on the decoding device of the fourth or fifth disclosure, further comprising: channel environment estimation section that estimates a channel environment for transmission of data to be decoded, wherein the decoding section sets the allowable communication speed by use of a channel environment estimate value acquired in the initial phase of communication.

A decoding device of a seventh disclosure that decodes received data including a header, including an error correction decoding section that subjects a soft decision value of the received data to error correction decoding by means of iterative decoding; a data error detection section that detects absence or presence of a data error on the basis of an output result of error correction decoding; and a control section that determines an effective number of bits of the received data that are a target of error correction decoding, on the basis of the number of iterations of iterative decoding during error correction decoding of the header and a detection result pertinent to the presence or absence of the data error.

A decoding device of an eighth disclosure is based on the decoding device of the seventh disclosure, further comprising a number-of-bits limit section that limits the effective number of bits of the soft decision value of the received data input to the error correction decoding section, wherein the number-of-bits limit section limits the effective number of bits of the soft decision value of the received data input to the error correction decoding section in accordance with the determined effective number of bits.

A decoding device of a ninth disclosure is based on the decoding device of the eighth disclosure, wherein the number-of-bits limit section fixes, among a plurality of bits that make up the soft decision value, the lowest order bit or a plurality of bits including the lowest order bit to zero in accordance with the determined effective number of bits.

A decoding device of a tenth disclosure is based on the decoding device of any one of the seventh disclosure to the ninth disclosure, wherein the control section has an effective-number-of-bits table that holds information about correspondence between the number of iterations of iterative decoding and the effective number of bits, and the control section determines the effective number of bits in accordance with the effective-number-of-bits table.

A decoding device of a eleventh disclosure is based on the decoding device of any one of the seventh disclosure to the tenth disclosure, wherein the control section increases the effective number of bits when the data error is detected during error correction decoding of a payload of the received data even after the number of iterations of iterative decoding exceeds a predetermined maximum number of iterations.

A decoding device of a twelfth disclosure is based on the decoding device of any one of the seventh disclosure to the eleventh disclosure, wherein the error correction decoding section subjects the input received data to error correction decoding by means of iterative decoding that uses a low density parity check code or a turbo code.

A decoding device of a thirteenth disclosure is based on the decoding device of any one of the seventh disclosure to the twelfth disclosure, wherein the data error detection section detects the data error in an output from the error correction decoding section by means of a parity check.

A decoding method of a fourteenth disclosure is a decoding method for decoding received data including a header, comprising a step of subjecting the header of the received data to error correction decoding by means of iterative decoding, a step of detecting presence or absence of a data error on the basis of an output result of error correction decoding, and a step of determining an effective number of bits of the received data that are a target of error correction coding on the basis of the number of iterations of iterative decoding in error correction decoding of the header and a result of detection of presence or absence of the data error.

A wireless communication device of a fifteenth disclosure includes the decoding device defined in any one of the first disclosure to the thirteenth disclosure.

Although various embodiments have been described by reference to the drawings, it goes without saying that the disclosures are not limited to the embodiments. It is manifest to those who are skilled in the art that various alterations or modifications of the invention be conceivable within the scope of claims, and it shall also be construed that the alterations or modifications naturally fall within a technical scope of the disclosures. Arbitrary combinations of the constituent elements of the embodiments are also conceivable within the scope of gist of the disclosures.

In the embodiments, the cases in which the invention is realized by hardware have been described. However, the invention may be realized by software in cooperation with hardware.

Further, respective function blocks used in the description of the embodiments may be typically realized by an LSI that is an integrated circuit. They may be individually fabricated into one chip or a part or the whole of them may be fabricated into one chip. Here, although LSI is exemplified, it may be called an IC, a system LSI, a super LSI, an ultra LSI, or the like, depending on the difference in integrity.

Further, the technique for the integrated circuit is not limited to LSI, and may be realized as a dedicated circuit or a general purpose processor. After the LSI fabrication, a FPGA (Field Programmable Gate array) that can be programmed after fabrication of the LSI or a reconfigurable processor that can reconfigure the connection or setting of the circuit cells in the LSI may be used.

Further, if technique for an integrated circuit appears, which substitutes LSI with the progress of the semiconductor technology or other derived technologies, the function blocks may be integrated using the technologies. Biotechnology may be possibly adapted.

This invention is based on Japanese Patent Application (Japanese Patent Application No. 2012-062492) filed on Mar. 19, 2012, and Japanese Patent Application (Japanese Patent Application No. 2012-127288) filed on Jun. 4, 2012 , the content of which is incorporated herein by reference.

INDUSTRIAL APPLICABILITY

The disclosures yield an advantage of the ability to perform high speed decoding operation and are useful as techniques that implement high-speed, low-power-consumption decoding operation for; for instance, an error correction decoding device that makes a correction to an error in a signal that develops in a transmission path of communication.

DESCRIPTIONS OF THE REFERENCE NUMERALS AND SYMBOLS

10 DECODING SECTION
11, 11-1 TO 11-N DECODING CORE
21 LIKELIHOOD STORAGE SECTION
22 SELECTION SECTION
23 CLOCK GENERATION SECTION
24 CLOCK GATE SECTION
25 HEADER ANALYSIS SECTION
26 WIRELESS TRANSMISSION SECTION
27 DEMODULATION SECTION
28 TRANSMISSION PATH ENVIRONMENT ESTIMATION SECTION
29 CLOCK FREQUENCY DIVIDING SECTION
31 POWER SOURCE
32 LOW VOLTAGE POWER SOURCE
33 SETTING SECTION
51, 52, 53, 54 CONTROL SECTION

111 COLUMN PROCESSING SECTION
112 ROW PROCESSING SECTION
113 PRIOR VALUE STORAGE SECTION
114 EXTERNAL VALUE STORAGE SECTION
115 HARD DECISION SECTION
300 TRANSCEIVER
301 ERROR CORRECTION DECODER
302 MODULATOR
303 DAC
304 TRANSMISSION ANALOG PROCESSING SECTION
305 PA SECTION
306 ANTENNA CIRCUIT
307 RECEIVING ANALOG PROCESSING SECTION
308 ADC
309 DEMODULATION SECTION
310 ERROR CORRECTION DECODER
311 DATA RECOGNITION SECTION
400 ERROR CORRECTION RECEIVER
401 NUMBER-OF-BITS LIMIT SECTION
402 ERROR CORRECTION DECODING SECTION
403 PARITY CHECK SECTION
404 CONTROL SECTION
405 CLOCK GENERATION SECTION
501 COLUMN PROCESSING SECTION
502 ROW PROCESSING SECTION

The invention claimed is:

1. A decoding device comprising:
a storage which, in operation, stores a plurality of likelihoods generated by demodulation of a received packet;
a decoder including a plurality of decoding cores which, in operation, perform decoding in parallel on a per-likelihood basis by use of respective partial check matrices, into which an check matrix used for decoding is divided, wherein the partial check matrices are matrices having rows that are equal in number to, or greater in number than, columns;
an MCS information acquisition section which, in operation, acquires MCS information about the received packet; and
a clock output which, in operation, selectively outputs a clock signal for operating the decoding cores, wherein, according to the MCS information, the clock output outputs the clock signal to decoding cores that are smaller in number than the decoding cores to which the clock signal is output during predetermined high speed communication, when a communication method for transmitting the received packet is predetermined low speed communication that is slower than the predetermined high speed communication.

2. A decoding device comprising:
a storage which, in operation, stores a plurality of likelihoods generated by demodulation of a received packet;
a decoder including a plurality of decoding cores which, in operation, perform decoding in parallel on a per-likelihood basis b use of respective partial check matrices, into which an check matrix used for decoding is divided, wherein the partial check matrices are matrices having rows that are equal in number to, or greater in number than, columns;
an MCS information acquisition section which, in operation, acquires MCS information about the received packet;
a clock output which, in operation, outputs, according to a level of multi-level modulation scheme included in the MCS information, a first clock signal used for normal operation of the decoding cores or a second clock signal that is slower than the first clock; and
a power source which, according to the level of multi-level modulation scheme included in the MCS information, outputs a first power source of normal operating voltage to be output to the decoder when the clock output outputs the first clock signal and outputs a second power source which is lower than the normal operating voltage when the clock output outputs the second clock signal.

3. The decoding device according to claim 2, wherein the power source notifies a communication partner of information about allowable communication speed of the decoding device in an initial phase of communication with the communication partner, and outputs a low voltage power of the second power source when the communication partner is notified that low speed communication with a low level of multi-level modulation is allowed.

4. The decoding device according to claim 3, further comprising:
a setting section which, in operation, receives user-oriented information about communication speed or power consumption, wherein, according to the user-oriented information, the clock output selects a clock signal to be output, and, according to the user-oriented information, the power source selects a voltage to be output.

5. The decoding device according to claim 3, further comprising:
a channel environment estimator which, in operation, estimates a channel environment for transmission of data to be decoded, wherein the decoder sets the allowable communication speed by use of a channel environment estimate value for the initial phase of communication.

* * * * *